(12) United States Patent
Kim et al.

(10) Patent No.: US 11,737,329 B2
(45) Date of Patent: Aug. 22, 2023

(54) DISPLAY APPARATUS HAVING COLUMN SPACER BETWEEN EMISSION PANEL AND COLOR PANEL

(71) Applicant: Samsung Display Co., Ltd., Yongin-si (KR)

(72) Inventors: Sunkwang Kim, Yongin-si (KR); Yoomi Ra, Yongin-si (KR); Kangmoon Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 337 days.

(21) Appl. No.: 17/094,068

(22) Filed: Nov. 10, 2020

(65) Prior Publication Data

US 2021/0359078 A1   Nov. 18, 2021

(30) Foreign Application Priority Data

May 12, 2020   (KR) .................. 10-2020-0056659

(51) Int. Cl.
| | |
|---|---|
| *H10K 59/131* | (2023.01) |
| *H10K 50/844* | (2023.01) |
| *H10K 50/86* | (2023.01) |
| *H10K 59/38* | (2023.01) |
| *H10K 59/126* | (2023.01) |
| *H10K 102/00* | (2023.01) |

(52) U.S. Cl.
CPC ....... *H10K 59/1315* (2023.02); *H10K 50/844* (2023.02); *H10K 50/865* (2023.02); *H10K 59/126* (2023.02); *H10K 59/38* (2023.02); *H10K 2102/3026* (2023.02); *H10K 2102/331* (2023.02)

(58) Field of Classification Search
CPC combination set(s) only.
See application file for complete search history.

(56) References Cited

U.S. PATENT DOCUMENTS

| | | | |
|---|---|---|---|
| 5,539,545 | A | 7/1996 | Shimizu et al. |
| 10,186,680 | B2 | 1/2019 | Lee |
| 10,559,646 | B2 | 2/2020 | Lee et al. |
| 2019/0189717 | A1* | 6/2019 | Choi .................. H01L 27/3246 |

(Continued)

FOREIGN PATENT DOCUMENTS

| KR | 10-2018-0009441 A | 1/2018 |
|---|---|---|
| KR | 10-2018-0104225 A | 9/2018 |
| KR | 10-2019-0051690 A | 5/2019 |

*Primary Examiner* — Nduka E Ojeh
(74) *Attorney, Agent, or Firm* — Lewis Roca Rothgerber Christie LLP

(57) ABSTRACT

A display apparatus includes: an emission panel comprising a first light-emitting diode, a second light-emitting diode, a third light-emitting diode, and a first power line, wherein the first light-emitting diode, the second light-emitting diode, and the third light-emitting diode have a stacked structure, and the first power line is in a laser drilling area around the pixel area and electrically connected to the first light-emitting diode, the second light-emitting diode, and the third light-emitting diode; and a color panel on the emission panel and comprising a first color area, a second color area, a third color area, which are each capable of transmitting light of different colors, and a light-blocking area, wherein a column spacer is between the emission panel and the color panel and has at least a portion overlapping the laser drilling area in a vertical direction.

20 Claims, 14 Drawing Sheets

(56) References Cited

U.S. PATENT DOCUMENTS

| | | | |
|---|---|---|---|
| 2020/0185638 A1* | 6/2020 | Choi | H10K 50/824 |
| 2020/0220099 A1 | 7/2020 | Park et al. | |
| 2020/0343315 A1* | 10/2020 | Lin | H01L 27/322 |
| 2021/0202670 A1* | 7/2021 | Koh | H01L 51/5237 |

* cited by examiner

DISPLAY APPARATUS HAVING COLUMN SPACER BETWEEN EMISSION PANEL AND COLOR PANEL

CROSS-REFERENCE TO RELATED APPLICATION

The present application claims priority to and the benefit of Korean Patent Application No. 10-2020-0056659, filed on May 12, 2020, in the Korean Intellectual Property Office, the entire disclosure of which is incorporated herein by reference.

BACKGROUND

1. Field

Aspects of one or more example embodiments relate to a display apparatus.

2. Description of Related Art

Generally, a display apparatus may be used in a mobile device, such as a smart phone, a laptop computer, a digital camera, a camcorder, a portable information terminal, a notebook, or a tablet personal computer, or in an electronic device such as a desktop computer, a television, an outdoor billboard, a display apparatus for exhibition, a dashboard for a vehicle, or a heads up display (HUD).

Display apparatuses include, for example, liquid crystal display apparatuses, which generally utilize a backlight, or light-emitting display apparatuses which generally include display elements that are capable of emitting light. A light-emitting display apparatus may include a pixel electrode, an opposite electrode, and an emission layer between the pixel electrode and the opposite electrode.

Recently, various designs have been developed to improve the quality of display apparatuses.

The above information disclosed in this Background section is only for enhancement of understanding of the background and therefore the information discussed in this Background section does not necessarily constitute prior art.

SUMMARY

Aspects of one or more example embodiments include a display apparatus capable of realizing high-quality images.

Additional aspects will be set forth in part in the description which follows and, in part, will be more apparent from the description, or may be learned by practice of the presented example embodiments according to the present disclosure.

A display apparatus according to some example embodiments of the present disclosure may include an emission panel including a first light-emitting diode, a second light-emitting diode, a third light-emitting diode, and a first power line, the first light-emitting diode, wherein the second light-emitting diode, and the third light-emitting diode are each arranged in a pixel area and each have a stacked structure including a pixel electrode, an intermediate layer having an emission layer, and an opposite electrode, and the first power line is arranged in a laser drilling area around the pixel area and electrically connected to the first light-emitting diode, the second light-emitting diode, and the third light-emitting diode, and a color panel arranged on the emission panel and including a first color area, a second color area, a third color area, which are each capable of transmitting light of different colors, and a light-blocking area, wherein a column spacer is arranged between the emission panel and the color panel and has at least a portion overlapping the laser drilling area in a vertical direction.

According to some example embodiments, the intermediate layer may extend from the pixel area to the laser drilling area, and include a through hole in the laser drilling area, the opposite electrode may integrally extend across the pixel area and the laser drilling area, and the first power line may be electrically connected to the opposite electrode through the through hole in the laser drilling area.

According to some example embodiments, a thin-film encapsulation layer may be arranged on the emission panel, a filler may be arranged on the color panel facing the emission panel, and the column spacer may be arranged in the filler, and at least a portion of the column spacer overlaps the laser drilling area to which the opposite electrode and the first power line are connected.

According to some example embodiments, the column spacer may be located in the laser drilling area.

According to some example embodiments, at least a portion of the column spacer may overlap the laser drilling area.

According to some example embodiments, a connection electrode may be arranged on the same layer as the pixel electrode in the laser drilling area, an upper surface of the connection electrode may be electrically connected to the opposite electrode, and a lower surface of the connection electrode may be electrically connected to the first power line.

According to some example embodiments, a first insulating layer covering at least a portion of the first power line may be arranged on the first power line, the connection electrode may be arranged on the first insulating layer, a second insulating layer covering at least a portion of the connection electrode and having an opening for a connection electrode may be arranged on the connection electrode, the intermediate layer may cover an outer surface of the second insulating layer, the through hole in the intermediate layer may overlap the opening for the connection electrode, and the opposite electrode may be electrically connected to the first power line through the opening for the connection electrode in the second insulating layer and the through hole in the intermediate layer.

According to some example embodiments, a first insulating layer covering at least a portion of the first power line and having an opening for a power line may be arranged on the first power line, the connection electrode may be arranged on the first insulating layer, a second insulating layer covering at least a portion of the connection electrode and having an opening for a connection electrode may be arranged on the connection electrode, the intermediate layer may cover the second insulating layer and the connection electrode, the through hole in the intermediate layer may overlap the opening for the power line and the opening for the connection electrode, and the opposite electrode may be electrically connected to the first power line through the opening for the power line in the first insulating layer, the opening for the connection electrode in the second insulating layer, and the through hole in the intermediate layer.

According to some example embodiments, a thin-film transistor electrically connected to each of the first light-emitting diode, the second light-emitting diode, and the third light-emitting diode and having a semiconductor layer, a gate electrode, a source electrode, and a drain electrode may be arranged in the pixel area, and the first power line may include a first conductive layer arranged on the same layer as the source electrode.

According to some example embodiments, a thin-film transistor electrically connected to each of the first light-emitting diode, the second light-emitting diode, and the third light-emitting diode and having a semiconductor layer, a gate electrode, a source electrode, and a drain electrode may be arranged in the pixel area, and the first power line may include a first conductive layer arranged on the same layer as the source electrode and a second conductive layer electrically connected to the first conductive layer.

According to some example embodiments, a conductive protective layer may cover the first power line.

According to some example embodiments, the color panel may include a light-blocking layer corresponding to the light-blocking area, a color conversion-transmissive layer including a color conversion unit converting incident light into light of other colors and a transmission unit transmitting the incident light, and a color layer including a plurality of color filters overlapping the color conversion-transmissive layer.

According to some example embodiments, the color conversion unit may include a plurality of quantum dots.

According to some example embodiments, the first power line may be arranged to be spaced apart from each other around a plurality of pixel areas which are adjacently arranged, and an area in which the laser drilling area and the column spacer overlap may be selectively arranged around the plurality of pixel areas.

A display apparatus according to some example embodiments of the present disclosure includes a first substrate including a plurality of pixel areas and a laser drilling area arranged around each pixel area, a light-emitting diode arranged in the pixel area, electrically connected to a thin-film transistor, and having a stacked structure including a pixel electrode, an intermediate layer having an emission layer, and an opposite electrode, a first power line arranged in the laser drilling area and electrically connected to the light-emitting diode, a thin-film encapsulation layer covering the pixel area and the laser drilling area, a second substrate including a first color area, a second color area, a third color area, which are each capable of transmitting light of different colors, and a light-blocking area, a filler covering the first color area, the second color area, the third color area, and the light-blocking area, and a column spacer arranged in the filler, wherein at least a portion of the column spacer may overlap the laser drilling area in a vertical direction.

According to some example embodiments, the filler may face the thin-film encapsulation layer, and at least a portion of the column spacer may overlap the laser drilling area to which the opposite electrode and the first power line are connected.

According to some example embodiments, the column spacer may be located in the laser drilling area.

According to some example embodiments, at least a portion of the column spacer may overlap the laser drilling area.

According to some example embodiments, the intermediate layer may extend from the pixel area to the laser drilling area and have a through hole in the laser drilling area, the opposite electrode may integrally extend across the pixel area and the laser drilling area, and the first power line may be electrically connected to the opposite electrode through the through hole in the laser drilling area.

According to some example embodiments, a connection electrode may be arranged on the same layer as the pixel electrode in the laser drilling area, an upper surface of the connection electrode may be electrically connected to the opposite electrode, and a lower surface of the connection electrode may be electrically connected to the first power line.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1A:
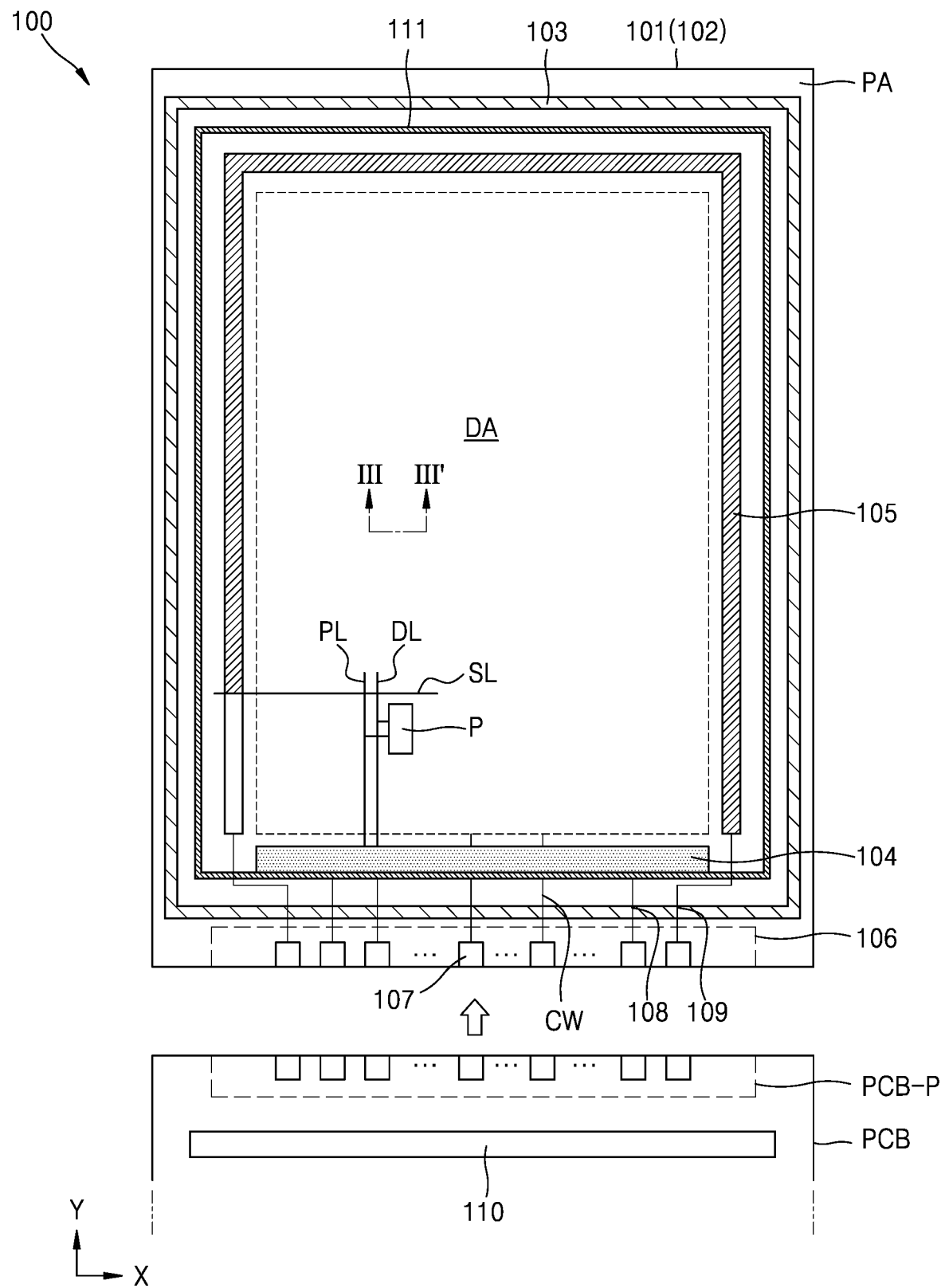
FIGS. 1A and 1B are schematic plan views of a display apparatus according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Reference will now be made in detail to embodiments, examples of which are illustrated in the accompanying drawings, wherein like reference numerals refer to like elements throughout. Effects and features of the present disclosure and methods of achieving the same will be apparent with reference to embodiments and drawings described below in detail. The present disclosure may, however, be embodied in many different forms and should not be construed as being limited to the example embodiments set forth herein.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. In other words, because sizes and thicknesses of elements in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While such terms as "first," "second," etc., may be used to describe various elements, such elements must not be limited to the above terms. The above terms are used only to distinguish one component from another.

In the following example embodiments, an expression used in the singular encompasses the expression of the plural, unless it has a clearly different meaning in the context.

In the following example embodiments, it is to be understood that the terms such as "including" and "having" are intended to indicate the existence of the features, or elements disclosed in the present disclosure, and are not intended to preclude the possibility that one or more other features or elements may exist or may be added.

When a certain embodiment may be implemented differently, a specific process order may be performed differently from the described order. For example, two consecutively described processes may be performed substantially at the same time or performed in an order opposite to the described order.

Hereinafter, aspects of some example embodiments of the present disclosure will now be described more fully with reference to the accompanying drawings. Like reference numerals in the drawings denote like elements, and thus descriptions thereof will be omitted.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

Figure 1B:
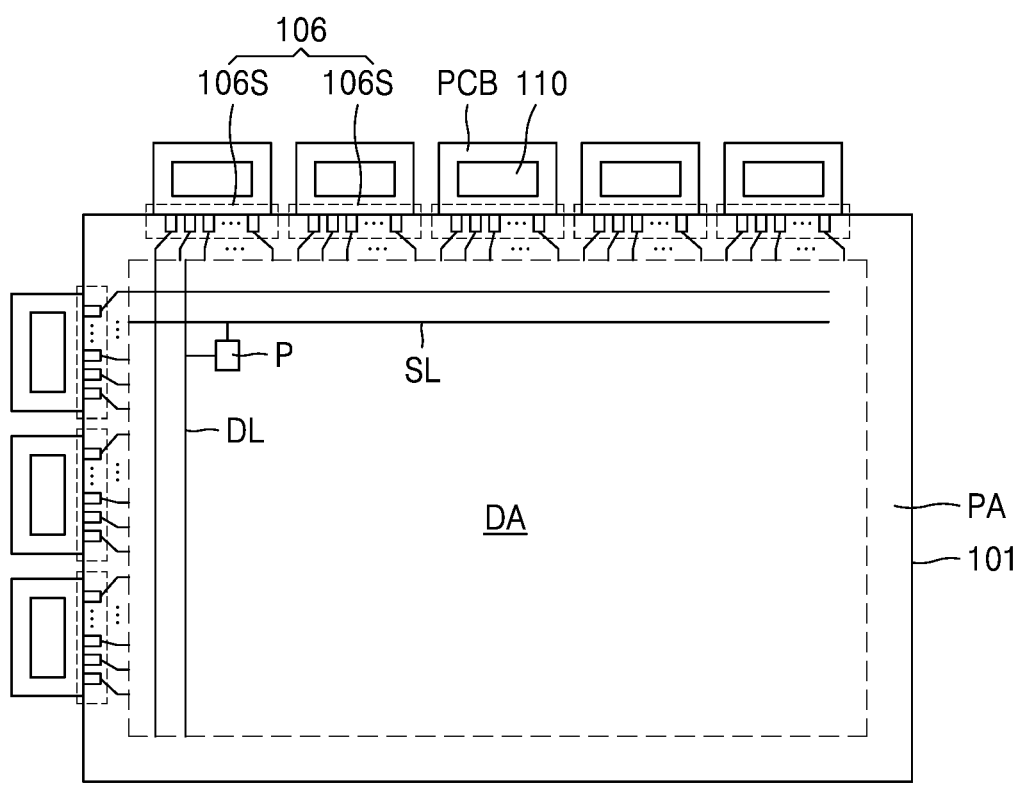

FIGS. 1A and 1B are schematic plan views of a display apparatus 100 according to some example embodiments.

Referring to FIG. 1A, the display apparatus 100 may be an apparatus configured to display images. The display apparatus 100 includes a first substrate 101 and a second substrate 102. A sealing member 103 may be arranged between the first substrate 101 and the second substrate 102. The sealing member 103 may surround the peripheries of the first substrate 101 and the second substrate 102 and bond the first substrate 101 to the second substrate 102.

The display apparatus 100 includes a display area DA and a peripheral area PA extending around the display area DA (e.g., around a periphery of the display area DA or outside a footprint of the display area DA). The display apparatus 100 may provide certain images by using light emitted from a plurality of pixels (e.g., pixels P) arranged in the display area DA.

The display area DA includes a plurality of pixels P connected to a data line DL extending in a Y-direction and a scan line SL extending in an X-direction crossing the Y-direction. Each pixel P may be connected to a driving voltage line PL extending in the Y-direction.

Each of the plurality of pixels P may include a display element such as an organic light-emitting diode (OLED). All of the OLEDs included in the plurality of pixels P may emit the same color of light, and the color of each pixel P may be implemented by a color filter arranged on an upper portion of the OLED. According to some example embodiments, each pixel P may emit, for example, red, green, blue, or white light through the OLED.

Each pixel P may be electrically connected to a plurality of built-in circuits arranged in the peripheral area PA. For example, a first power supply line 104, a second power supply line 105, and a pad unit 106 may be arranged in the peripheral area PA.

The first power supply line 104 may be arranged on one side of the display area DA, for example, a lower end of the display apparatus 100. The first power supply line 104 may be connected to a plurality of driving voltage lines PL transferring a driving voltage ELVDD to the pixel P.

The second power supply line 105 may partially surround the display area DA in a loop shape with one side open. The second power supply line 105 may provide a common voltage to an opposite electrode of the pixel P.

The pad unit 106 may include a plurality of pads 107, and may be arranged on one side of the first substrate 101. Each of the pads 107 may be connected to a first connection line 108 connected to the first power supply line 104 or a connection wire CW extending to the display area DA. Each of the pads 107 may be electrically connected to a printed circuit board PCB. A printed circuit board (PCB) terminal unit PCB-P of the printed circuit board PCB may be electrically connected to the pad unit 106.

The PCB may transmit a signal or power of a controller to the pad unit 106. The controller may provide a driving voltage and common voltage ELVDD and ELVSS to the first and second power supply lines 104 and 105, respectively, via the first and second connection lines 108 and 109.

A data driving circuit 110 is electrically connected to the data line DL. A data signal of the data driving circuit 110 may be provided to each pixel P through the connection wire CW connected to the pad unit 106 and the data line DL connected to the connection wire CW. Although FIG. 1 illustrates that the data driving circuit 110 is arranged in the PCB, the data driving circuit 110 may be arranged above the first substrate 101 according to some example embodiments. For example, the data driving circuit 110 may be arranged between the pad unit 106 and the first power supply line 104.

A dam unit 111 may be arranged in the peripheral area PA. The dam unit 111 may prevent or reduce an edge tail of an organic encapsulation layer 422 being formed, by blocking an organic material from flowing in an edge direction of the first substrate 101 when forming the organic encapsulation layer 422 of a thin-film encapsulation layer 419 of FIG. 3. The dam unit 111 may surround at least a portion of the display area DA. The dam unit 111 may include a plurality of dams. When the dam unit 111 includes a plurality of dams, each dam may be spaced apart from each other. The dam unit 111 may be arranged closer to the display area DA than the sealing member 103.

Although FIG. 1A illustrates that one PCB is attached to the pad unit 106, a plurality of PCBs may be attached to the pad unit 106, as shown in FIG. 1B. The pad unit 106 may be arranged along two sides of the first substrate 101. The pad unit 106 may include a plurality of sub-pad units 106s, and each printed circuit board PCB may be attached to each sub-pad unit 106s.

Figure 2A:
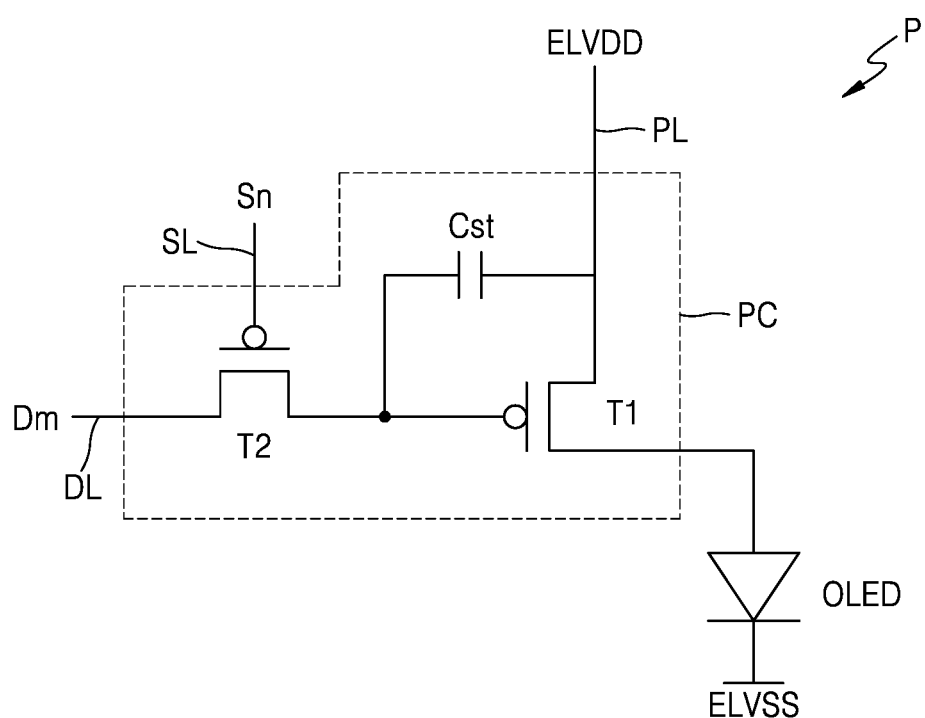
FIGS. 2A and 2B are equivalent circuit diagrams of a pixel which may be included in the display apparatus of FIGS. 1A and 1B, according to some example embodiments.
Figure 2B:
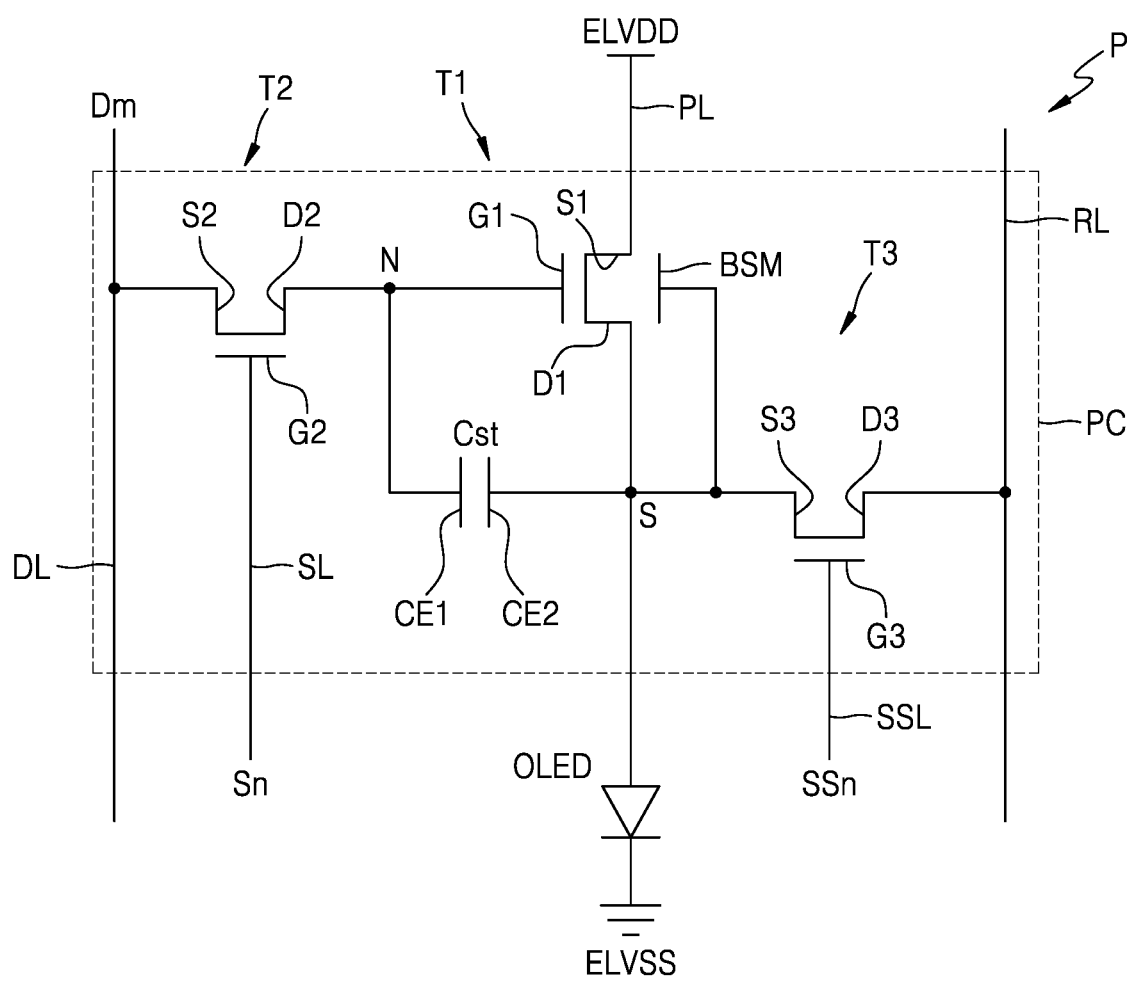

FIGS. 2A and 2B are equivalent circuit diagrams of a pixel P according to some example embodiments which may be included in the display apparatus 100 of FIGS. 1A and 1B.

Referring to FIG. 2A, each pixel P includes a pixel circuit PC connected to the scan line SL and the data line DL and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to deliver, to the driving thin-film transistor T1, a data signal Dm input through the data line DL, according to a scan signal Sn input through the scan line SL.

The storage capacitor Cst is connected to the switching thin-film transistor T2 and the driving voltage line PL and store a voltage corresponding to a difference between a voltage received from the switching thin-film transistor T2 and the driving voltage ELVDD supplied to the driving voltage line PL.

The driving thin-film transistor T1 may be connected to the driving voltage line PL and the storage capacitor Cst and may control a driving current flowing from the driving voltage line PL to the organic light-emitting diode OLED in accordance with a voltage value stored in the storage capacitor Cst. The organic light-emitting diode OLED may emit light having a certain brightness according to the driving current.

Although FIG. 2A illustrates that the pixel circuit PC includes two thin-film transistors and one storage capacitor, embodiments according to the present disclosure are not limited thereto.

Referring to FIG. 2B, each pixel P may include the organic light-emitting diode OLED and the pixel circuit PC including a plurality of thin-film transistors driving the organic light-emitting diode OLED. The pixel circuit PC may include the driving thin-film transistor T1, the switching thin-film transistor T2, a sensing thin-film transistor T3, and the storage capacitor Cst.

The scan line SL may be connected to a gate electrode G2 of the switching thin-film transistor T2, the data line DL may be connected to a source electrode S2 of the switching thin-film transistor T2, and a first electrode CE1 of the storage capacitor Cst may be connected to a drain electrode D2 of the switching thin-film transistor T2. Accordingly, the switching thin-film transistor T2 supplies, to a first node N, a data voltage of the data line DL in response to the scan signal Sn from the scan line SL of each pixel P.

A gate electrode G1 of the driving thin-film transistor T1 may be connected to the first node N, a source electrode S1 of the driving thin-film transistor T1 may be connected to the driving voltage line PL configured to transfer the driving voltage ELVDD, and a drain electrode D1 of the driving thin-film transistor T1 may be connected to an anode electrode of the organic light-emitting diode OLED. Accordingly, the driving thin-film transistor T1 may adjust an amount of current flowing to the organic light-emitting diode OLED according to a voltage Vgs between a source and a gate of the driving thin-film transistor T1, that is, a voltage between the driving voltage ELVDD and the first node N.

A sensing control line SSL is connected to a gate electrode G3 of the sensing thin-film transistor T3, a source electrode S3 of the sensing thin-film transistor T3 is connected to a second node S, and a drain electrode D3 of the sensing thin-film transistor T3 is connected to a reference voltage line RL. According to some example embodiments, the sensing thin-film transistor T3 may be controlled by the scan line SL instead of the sensing control line SSL.

The sensing thin-film transistor T3 may sense an electric potential of a pixel electrode (for example, an anode electrode) of the organic light-emitting diode OLED. The sensing thin-film transistor T3 supplies, to the second node S, a pre-charging voltage from the reference voltage line RL in response to a sensing signal SSn from the sensing control line SSL or supplies, to the reference voltage line RL, a voltage of the pixel electrode (for example, the anode electrode) of the organic light-emitting diode OLED during a sensing period.

The first electrode CE1 of the storage capacitor Cst is connected to the first node N, and a second electrode CE2 of the storage capacitor Cst is connected to the second node S. The storage capacitor Cst charges a difference voltage between voltages respectively supplied to the first node N and the second node S and supplies the charged difference voltage as a driving voltage of the driving thin-film transistor T1. For example, the storage capacitor Cst may charge a difference voltage between a data voltage Dm and a pre-charging voltage Vpre respectively supplied to the first node N and the second node S.

A bias electrode BSM may be formed to correspond to the driving thin-film transistor T1 and may be connected to the source electrode S3 of the sensing thin-film transistor T3. The bias electrode BSM may receive a voltage associated with an electric potential of the source electrode S3 of the sensing thin-film transistor T3, and thus, the driving thin-film transistor T1 may be stabilized. According to some example embodiments, the bias electrode BSM may not be connected to the source electrode S3 of the sensing thin-film transistor T3 and may be connected to a separate bias line.

An opposite electrode (for example, a cathode electrode) of the organic light-emitting diode OLED receives the common voltage ELVSS. The organic light-emitting diode OLED receives the driving current from the driving thin-film transistor T1 to emit light.

Although FIG. 2B illustrates that each pixel P includes signal lines SL, SSL, and DL, the reference voltage line RL, and the driving voltage line PL, embodiments according to the present disclosure are not limited thereto. For example, at least one of the signal lines SL, SSL, or DL, the reference voltage line RL, or the driving voltage line PL may be shared by neighboring pixels.

The pixel circuit PC is not limited to the number of the thin-film transistors and the storage capacitors and the circuit design described with reference to FIGS. 2A and 2B, and the number of the thin-film transistors and the storage capacitors and the circuit design may be variously changed. That is, according to some example embodiments, the number of electrical components illustrated in FIGS. 2A and 2B may vary, and there may be additional or fewer electrical components, without departing from the spirit and scope of embodiments according to the present disclosure.

Figure 3:
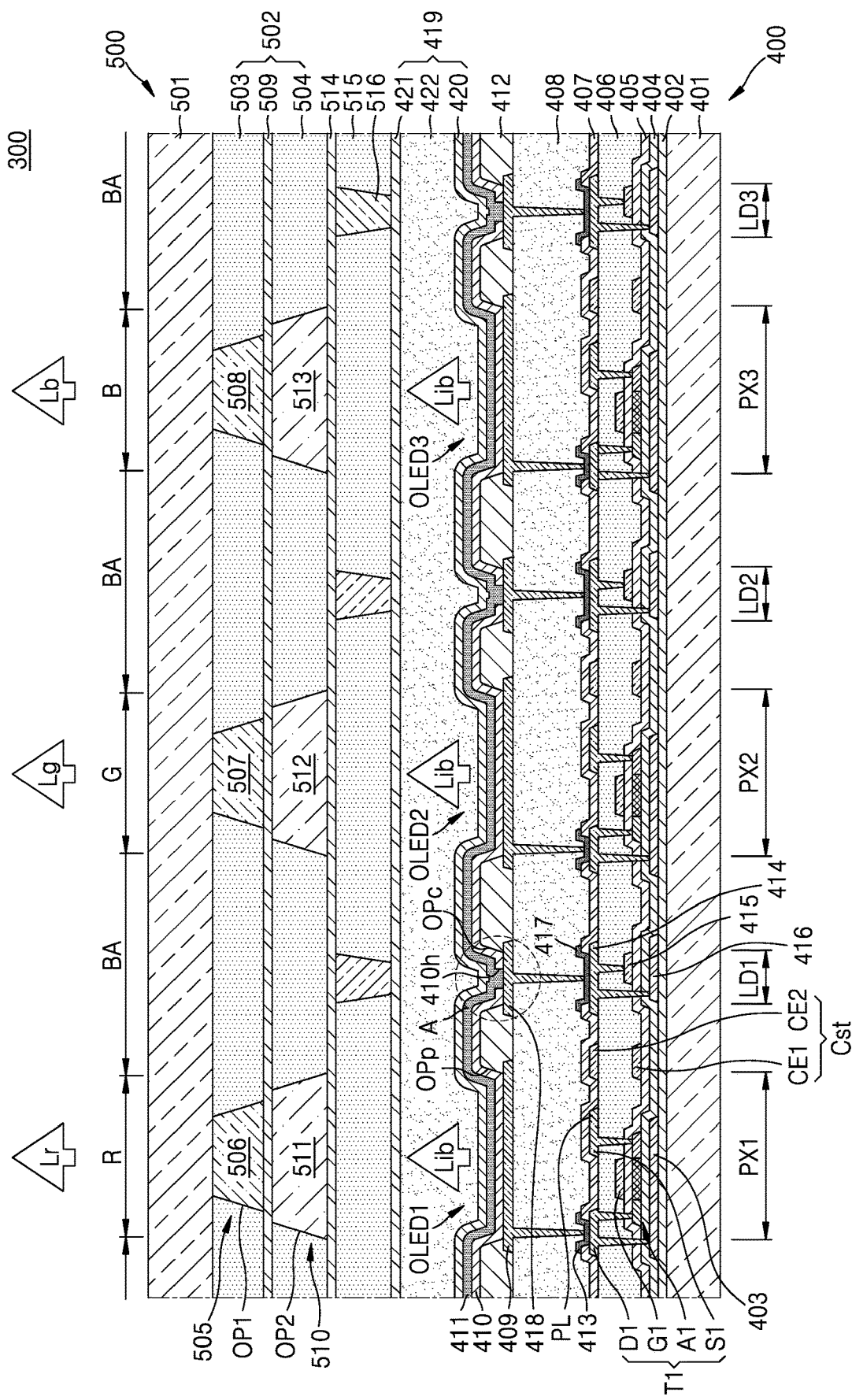
FIG. 3 is a cross-sectional view of a portion of a display apparatus according to some example embodiments.

FIG. 3 is a cross-sectional view of a portion of a display apparatus 300 according to some example embodiments.

The display apparatus 300 of FIG. 3 may be a cross-sectional view of a portion of a display area taken along the line III-III' of FIG. 1A. The driving thin-film transistor T1 and the storage capacitor Cst in the pixel circuit PC of the pixel P described above are illustrated in the display area of FIG. 3.

Referring to FIG. 3, the display apparatus 300 includes an emission panel 400 and a color panel 500.

A plurality of pixel areas PX, for example, a first pixel area PX1, a second pixel area PX2, and a third pixel area PX3 may be arranged in the emission panel 400. This is only an example, and the display apparatus 300 may include more pixel areas PX. Although the first pixel area PX1, the second pixel area PX2, and the third pixel area PX3 are illustrated as being adjacent to each other in FIG. 3, embodiments according to the present disclosure are not limited thereto. Cross sections of the first pixel area PX1, the second pixel area PX2, and the third pixel area PX3 may not be cross sections in the same direction.

A first organic light-emitting diode OLED1, a second organic light-emitting diode OLED2, and a third organic light-emitting diode OLED3 are respectively arranged corresponding to the first pixel area PX1, the second pixel area PX2, and the third pixel area PX3. The pixel area PX may corresponding to an emission area of the organic light-emitting diode OLED. A laser drilling area LD in which a first power line 414 is arranged, for example, a first laser drilling area LD1, a second laser drilling area LD2, or a third laser drilling area LD3, may be respectively arranged around each of the first pixel area PX1, the second pixel area PX2, or the third pixel area PX3. The laser drilling area LD may be a portion of a non-pixel area NPX.

Hereinafter, because the first pixel area PX1, the second pixel area PX2, and the third pixel area PX3 include elements having the same stacked structure, the first pixel area PX1 will be described as an example.

The emission panel 400 includes a first substrate 401. The first substrate 401 may include a material such as glass, ceramic, a metal, or a polymer. A first buffer layer 402 may be arranged on the first substrate 401. The first buffer layer 402 may block penetration of foreign substances or moisture through the first substrate 401. For example, the first buffer layer 402 may include an inorganic material such as silicon oxide, silicon nitride, and silicon oxynitride, and may include a single layer or a multilayer.

A bias electrode 403 may be arranged on the first buffer layer 402 to correspond to the driving thin-film transistor T1. The bias electrode 403 may overlap a semiconductor layer A1 of the driving thin-film transistor T1. A voltage may be applied to the bias electrode 403. For example, the bias electrode 403 may be connected to the source electrode (S3 in FIG. 2B) of the sensing thin-film transistor (T3 in FIG. 2B), and a voltage of the source electrode S3 may be applied to the bias electrode 403. In addition, the bias electrode 403 may prevent or reduce external light reaching the semiconductor layer A1. Accordingly, characteristics of the driving thin-film transistor T1 may be stabilized. According to some example embodiments, the bias electrode 403 may be omitted.

A second buffer layer 404 may cover the bias electrode 403. The second buffer layer 404 may be arranged over an entire area of the first substrate 401. The second buffer layer 404 may include an inorganic material such as silicon oxide, silicon nitride, and silicon oxynitride, and may include a single layer or a multilayer.

The semiconductor layer A1 may be arranged on the second buffer layer 404. The semiconductor layer A1 may include polysilicon, amorphous silicon, an oxide semiconductor, an organic semiconductor material, or the like. According to some example embodiments, the semiconductor layer A1 may include a channel area overlapping the gate electrode G1 of the driving thin-film transistor T1, a source area and a drain area respectively arranged on both sides of the channel area and including impurities at a higher concentration than that of the channel area. The impurities may include an N-type impurity or a P-type impurity.

A gate insulating layer 405 may cover the semiconductor layer A1. The gate insulating layer 405 may include an inorganic material such as silicon oxynitride, silicon oxide, and silicon nitride, and may include a single layer or a multilayer. The gate electrode G1 may be arranged on the gate insulating layer 405. The gate electrode G1 may include molybdenum (Mo), aluminum (Al), copper (Cu), titanium (T1), or the like. The gate electrode G1 may include a single layer or a multilayer.

The first electrode CE1 of the storage capacitor Cst may be arranged on the same layer as the gate electrode G1. The first electrode CE1 may include the same material as the gate electrode G1. For example, according to some example embodiments, the first electrode CE1 and the gate electrode G1 may be deposited or formed as part of a same deposition operation, although embodiments are not limited thereto.

A first interlayer insulating layer 406 may cover the gate electrode G1 and the first electrode CE1 of the storage capacitor Cst. The first interlayer insulating layer 406 may include an inorganic material such as silicon oxynitride, silicon oxide, and silicon nitride. The first interlayer insulating layer 406 may include a single layer or a multilayer.

The source electrode S1, the drain electrode D1, the second electrode CE2 of the storage capacitor Cst, and the driving voltage line PL may be arranged on the first interlayer insulating layer 406. The source electrode S1, the drain electrode D1, the second electrode CE2 of the storage capacitor Cst, and the driving voltage line PL may include Al, Cu, Ti, or the like, and may include a single layer or a multilayer. According to some example embodiments, the source electrode S1, the drain electrode D1, the second electrode CE2 of the storage capacitor Cst, and the driving voltage line PL may include a multilayer of Ti/Al/Ti. The source electrode S1 and the drain electrode D1 may be respectively connected to a source area and a drain area of the semiconductor layer A1 through a contact hole. The source electrode S1 may be connected to the driving voltage line PL.

The second electrode CE2 of the storage capacitor Cst may overlap the first electrode CE1 with the first interlayer insulating layer 406 therebetween to from a capacitance. In this case, the first interlayer insulating layer 406 may perform a function of a dielectric layer of the storage capacitor Cst. A thickness of the first interlayer insulating layer 406 may be designed according to a value of the capacitance of the storage capacitor Cst.

A protective layer 407 may cover the source electrode S1, the drain electrode D1, the second electrode CE2 of the storage capacitor Cst, and the driving voltage line PL. The protective layer 407 may include an inorganic material such as silicon oxynitride, silicon oxide, and silicon nitride. The protective layer 407 may protect conductive layers or lines arranged on the first interlayer insulating layer 406.

A first insulating layer 408 may be arranged on the protective layer 407. The first insulating layer 408 may be a planarization layer. The first insulating layer 408 may include an organic material, and the organic material may include an imide polymer, a general commercial polymer such as poly(methyl methacrylate) or polystyrene, a polymer derivative having a phenol group, an acrylic polymer, an aryl ether polymer, an amide polymer, a fluorine polymer, a p-xylene polymer, a vinyl alcohol polymer, and a mixture thereof. According to some example embodiments, the first insulating layer 408 may include polyimide.

When the protective layer 407 including an inorganic material is omitted, the conductive layers or lines such as the driving voltage line PL may be oxidized or corroded by reacting with oxygen penetrated from the first insulating layer 408. However, in embodiments in which the protective layer 407 is included as illustrated, for example, in FIG. 3, the conductive layers or lines such as the driving voltage line PL may not directly contact the first insulating layer 408.

In the first pixel area PX1, the first organic light-emitting diode OLED1 may be arranged on the first insulating layer 408. The first organic light-emitting diode OLED1 includes a pixel electrode 409, an intermediate layer 410 including an emission layer, and an opposite electrode 411.

The pixel electrode 409 may be electrically connected to the drain electrode D1 through a contact hole penetrating the first insulating layer 408. The pixel electrode 409 may be connected to the drain electrode D1 via a conductive protective layer 413. The conductive protective layer 413 may cover the drain electrode D1. The conductive protective layer 413 may be a metal layer configured to prevent or reduce damage to the drain electrode D1.

The pixel electrode 409 may be a (semi)transparent electrode or a reflective electrode. According to some example embodiments, the pixel electrode 409 may include a reflective layer including silver (Ag), magnesium (Mg), Al, platinum (Pt), palladium (Pd), gold (Au), nickel (Ni), neodymium (Nd), iridium (Ir), chromium (Cr), a compound thereof, or the like, and a transparent or semi-transparent electrode layer formed on the reflective layer. The transparent or semi-transparent electrode layer may include at least one of an indium tin oxide (ITO), an indium zinc oxide (IZO), a zinc oxide (ZnO), an indium oxide ($In_2O_3$), an indium gallium oxide (IGO), or an aluminum oxide (AZO). According to some example embodiments, the pixel electrode 409 may be ITO/Ag/ITO.

A second insulating layer 412 may be arranged on the first insulating layer 408. The second insulating layer 412 may be a pixel defining film. The second insulating layer 412 may have an opening OPp for a pixel electrode exposing a portion of the pixel electrode 409, thereby defining an emission area. The second insulating layer 412 may include an organic material such as polyimide or hexamethyldisiloxane.

The intermediate layer 410 may include an emission layer. According to some example embodiments, the intermediate layer 410 may be commonly provided in the first organic light-emitting diode OLED1, the second organic light-emitting diode OLED2, and the third organic light-emitting diode OLED3 respectively arranged in the first pixel area PX1, the second pixel area PX2, and the third pixel area PX3. Accordingly, the first organic light-emitting diode OLED1, the second organic light-emitting diode OLED2, and the third organic light-emitting diode OLED3 may emit the same color of light. For example, the intermediate layer 410 may include an organic emission layer including a fluorescent material or phosphorescent material emitting blue light.

A functional layer such as a hole transport layer (HTL), a hole injection layer (HIL), an electron transport layer (ETL), an electron injection layer (EIL), or the like may be further selectively arranged above or below the emission layer. The intermediate layer 410 having the emission layer may integrally extend over the first organic light-emitting diode OLED1, the second organic light-emitting diode OLED2, and the third organic light-emitting diode OLED3.

The opposite electrode 411 may be a transparent electrode or a reflective electrode. According to some example embodiments, the opposite electrode 411 may be a transparent or semi-transparent electrode, and may include a metal thin film having a small work function including lithium (Li), calcium (Ca), lithium fluoride (LiF)/Ca, LiF/Al, Ag, Mg, and a compound thereof. In addition, a transparent conductive oxide (TCO) film such as ITO, IZO, ZnO, $In_2O_3$, or the like may be further arranged above the metal thin film. The opposite electrode 411 may extend not only to the display area DA, but also to the peripheral area PA outside the display area DA shown in FIG. 1. The opposite electrode 411 may be arranged on the intermediate layer 410.

The laser drilling area LD in which the first power line 414 is arranged, for example, the first laser drilling area LD1, the second laser drilling area LD2, or the third laser drilling area LD3, may be respectively arranged around each of the first pixel area PX1, the second pixel area PX2, or the third pixel area PX3.

Hereinafter, because the first laser drilling area LD1, the second laser drilling area LD2, and the third laser drilling area LD3 include elements having the same stacked structure, the first laser drilling area LD1 will be described as an example.

The first power line 414 may be arranged in the first laser drilling area LD1. The first power line 414 may be a line which applies the common voltage ELVSS. Each first power line 414 may extend in a Y-direction (see, e.g., FIG. 5), and a plurality of first power lines 414 may be arranged to be spaced apart from each other in an X-direction crossing the Y-direction. The first power line 414 may be arranged on the first interlayer insulating layer 406. The first power line 414 may be arranged on the same layer as the source electrode S1, the drain electrode D1, the second electrode CE2 of the storage capacitor Cst, and the driving voltage line PL. The first power line 414 may include a conductive material such as Al, Cu, Ti, or the like, and may be formed of a single layer or multiple layers.

At least one of the lower line 415 or 416 may be arranged below the first power line 414. For example, a first lower line 415 and a second lower line 416 may be arranged below the first power line 414. The first lower line 415 may be arranged on the same layer as the gate electrode G1, and may include the same material as the gate electrode G1. The second lower line 416 may be arranged on the same layer as the bias electrode 403, and may include the same material as the bias electrode 403. When a display apparatus has a relatively large area, a voltage drop due to the self or internal resistance of the first power line 414 may occur. However, when the first power line 414 is electrically connected to the first lower line 415 and the second lower line 416, the voltage drop due to the self-resistance of the first power line 414 may be effectively prevented or reduced (e.g., minimized).

A conductive protective layer 417 may cover a portion of the first power line 414, The conductive protective layer 417 may cover an exposed portion of the first power line 414 to prevent or reduce damage to the first power line 414. The conductive protective layer 417 may include a multilayer structure, and may be a conductive material or metal having a lower oxidation degree or a conductive material or metal having higher corrosion resistance than a material provided on an uppermost layer of the first power line 414.

According to some example embodiments, the uppermost layer of the first power line 414 may include copper, and the conductive protective layer 417 may include titanium. According to some example embodiments, the conductive protective layer 417 may include an oxide having conductivity. For example, the conductive protective layer 417 may include at least one of ITO, IZO, ZnO, $In_2O_3$, IGO, or AZO.

The first insulating layer 408 may cover the first power line 414 and the conductive protective layer 417 which are stacked. A connection electrode 418 may be arranged on the first insulating layer 408. The connection electrode 418 may be arranged on the same layer as the pixel electrode 409, and may include the same material as the pixel electrode 409. The connection electrode 418 may be connected to the first power line 414 through a contact hole penetrating the first insulating layer 408. The connection electrode 418 may be connected to the first power line 414 via the conductive protective layer 417.

The second insulating layer 412 may be arranged on the connection electrode 418. The second insulating layer 412 may have an opening OPc for a connection electrode exposing a portion of the connection electrode 418. The second insulating layer 412 may cover an edge of the connection electrode 418, and portions of the connection electrode 418 other than the edge may be exposed to the outside.

The intermediate layer 410 may be arranged on the second insulating layer 412. As described above, the intermediate layer 410 may be commonly provided in the first organic light-emitting diode OLED1, the second organic light-emitting diode OLED2, and the third organic light-emitting diode OLED3 respectively arranged in the first pixel area PX1, the second pixel area PX2, and the third pixel area PX3. The intermediate layer 410 may extend from the first pixel area PX1, the second pixel area PX2, and the third pixel area PX3 to the first laser drilling area LD1, the second laser drilling area LD2, and the third laser drilling area LD3, respectively, as a single body.

Figure 4:
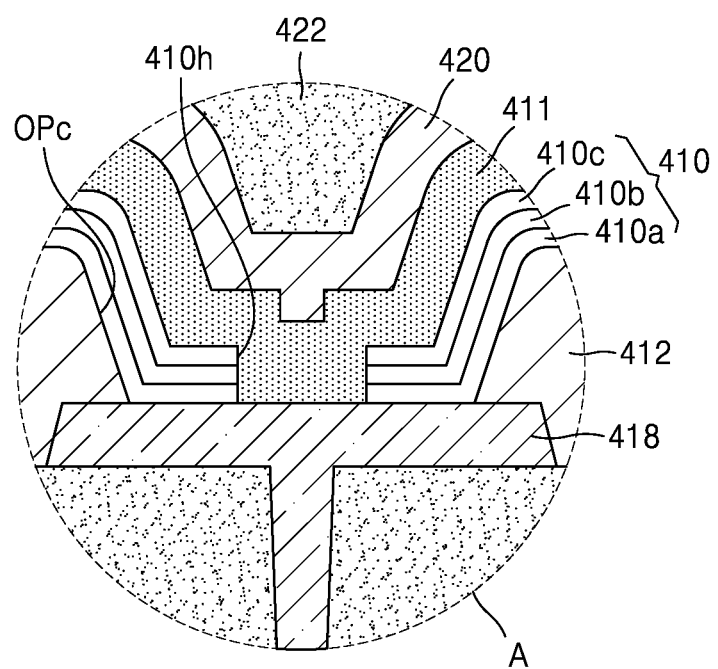
FIG. 4 is an enlarged cross-sectional view of an A portion of the display apparatus of FIG. 3, according to some example embodiments.

The intermediate layer 410 may include a through hole 410h overlapping the opening OPc for the connection electrode formed in the second insulating layer 412. As shown in FIG. 4 showing an enlarged view of the display apparatus, the intermediate layer 410 may include a first functional layer 410a, an emission layer 410b, and a second functional layer 410c. The through hole 410h may penetrate the first functional layer 410a, the emission layer 410b, and the second functional layer 410c. The through hole 410h may be formed through the first functional layer 410a, the emission layer 410b, and the second functional layer 410c by a laser drilling operation. The first functional layer 410a may include a HTL and/or a HIL, and the second functional layer 410c may include an ETL and/or an EIL.

The opposite electrode 411 may be arranged on the intermediate layer 410. The opposite electrode 411 may, as the same as the intermediate layer 410, respectively extend from the first pixel area PX1, the second pixel area PX2, and the third pixel area PX3 to the first laser drilling area LD1, the second laser drilling area LD2, and the third laser drilling area LD3 as a single body.

The opposite electrode 411 may be connected to the connection electrode 418 through the through hole 410h and the opening OPc for the connection electrode, the through hole 410h and the opening OPc being in communication with each other. The opposite electrode 411 may be electrically connected to the first power line 414 via the connection electrode 418 and the conductive protective layer 417. Because the opposite electrode 411 has a relatively large area to entirely cover the display area DA shown in FIG. 1, a resistance of the opposite electrode 411 may vary depending on the self-resistance of the opposite electrode 411 in each area. However, when the first power line 414 crossing the display area DA is electrically connected to the opposite electrode 411, a voltage drop due the self-resistance of the opposite electrode 411 may be prevented or reduced.

The first organic light-emitting diode OLED1, the second organic light-emitting diode OLED2, and the third organic light-emitting diode OLED3 may be easily damaged by moisture or oxygen, or the like from the outside. The thin-film encapsulation layer 419 may cover the first organic light-emitting diode OLED1, the second organic light-emitting diode OLED2, and the third organic light-emitting diode OLED3.

The thin-film encapsulation layer 419 may not only extend to a portion of the display area shown in FIG. 3, but also extend from the display area DA to the peripheral area PA shown in FIG. 1. The thin-film encapsulation layer 419 may include at least one of inorganic encapsulation layers 420 or 421 and at least one organic encapsulation layer 422. According to some example embodiments, the thin-film encapsulation layer 419 may be a structure in which a first inorganic encapsulation layer 420, the organic encapsulation layer 422, and a second inorganic encapsulation layer 421 are sequentially stacked.

The first inorganic encapsulation layer 420 may cover the opposite electrode 411, and may include silicon oxynitride, silicon oxide, silicon nitride, or the like. According to some example embodiments, other layers such as a capping layer may be arranged between the opposite electrode 411 and the first inorganic encapsulation layer 420. The first inorganic encapsulation layer 420 is formed along an underlying structure, an upper surface of the first inorganic encapsulation layer 420 may not be flat.

The organic encapsulation layer 422 may cover the first inorganic encapsulation layer 420. The thickness of the organic encapsulation layer 422 may be greater than the thickness of the first inorganic encapsulation layer 420 and the second inorganic encapsulation layer 421. The organic encapsulation layer 422 may have a thickness sufficient to planarize steps in the first pixel area PX1, the second pixel area PX2, and the third pixel area PX3 and steps in the first laser drilling area LD1, the second laser drilling area LD2, and the third laser drilling area LD3.

The organic encapsulation layer 422 may include at least one of polyethylene terephthalate, polyethylene naphthalate, polycarbonate, polyethylene sulfonate, polyimide, polyarylate, polyoxymethylene, or hexamethyldisiloxane.

The second inorganic encapsulation layer 421 may cover the organic encapsulation layer 422, and may include silicon oxynitride, silicon oxide, silicon nitride, or the like.

Even when cracks occur in the thin-film encapsulation layer 419, connection of cracks between the first inorganic encapsulation layer 420 and the organic encapsulation layer 422 or between the organic encapsulation layer 422 and the second inorganic encapsulation layer 421 may be prevented or reduced.

Light generated by an emission panel 200 having the above structure may be incident on the color panel 500. Incident light Lib on the color panel 500 may be converted into light having different colors or may be emitted to the outside with the same color.

The color panel 500 includes a second substrate 501. The second substrate 501 may be a transparent substrate. The second substrate 501 may include transparent glass or a transparent resin. The second substrate 501 may be a transparent glass substrate including silicon oxide as a main component. According to some example embodiments, the second substrate 501 may include a polymer resin. The polymer resin may include a polymer resin such as polyethersulfone, polyacrylate, polyetherimide, polyethylene naphthalate, polyethylene terephthalate, polyphenylene sulfide, polyarylate, polyimide, cellulose acetate propionate, and polycarbonate.

A first color area R, a second color area G, and a third color area B may be arranged on a lower surface of the second substrate 501 facing the emission panel 400. Although the first color area R, the second color area G, and the third color area B are illustrated as being adjacent to each other in FIG. 3, embodiments according to the present disclosure are not limited thereto. In addition, cross-sections of the first color area R, the second color area G, and the third color area B may not be cross-sections in the same direction. A light-blocking area BA may be arranged between the first color area R, the second color area G, and the third color area B. The light-blocking area BA may be an area through which light may not pass, and may be arranged in a mesh form between the first color area R, the second color area G, and the third color area B.

The first color area R, the second color area G, and the third color area B may correspond to the first pixel area PX1, the second pixel area PX2, and the third pixel area PX3. The first color area R, the second color area G, and the third color area B may be distinguished according to a color of light emitted. For example, the first color area R may be an area where light of first color Lr is emitted, the second color area G may be an area where light of second color Lg is emitted, and the third color area B may be an area where light of third color Lb is emitted.

The light of first color Lr may be red light, the light of second color Lg may be green light, and the light of third color Lb may be blue light. The red light may have a peak wavelength of 580 nm or more and less than 750 nm, the green light may have a peak wavelength of 495 nm or more and less than 580 nm, and the blue light may have a peak wavelength of 400 nm or more and less than 495 nm.

The incident light Lib may be the light of third color Lb, and the incident light Lib may be converted or transmitted through the first to third color areas R, G, and B. Accordingly, the light of first to third colors Lr, Lg, and Lb may be emitted through the color panel 500.

The color panel 500 may include a light-blocking layer 502, a color layer 505, and a color conversion-transmissive layer 510 which are arranged on a lower surface of the second substrate 501.

The light-blocking layer 502 may include a first light-blocking layer 503 and a second light-blocking layer 504.

The first light-blocking layer 503 and the second light-blocking layer 504 may include black color or white color, or may include various colors, such as including black color or blue color. For example, one of the first light-blocking layer 503 and the second light-blocking layer 504 may be black color, and the other one may be black color or blue color. According to some example embodiments, the first light-blocking layer 503 and the second light-blocking layer 504 may be the same color. The first light-blocking layer 503 and the second light-blocking layer 504 may include an opaque inorganic material such as chromium oxide or molybdenum oxide or the like, or may include an opaque organic insulating material such as black resin or the like. The first light-blocking layer 503 and/or the second light-blocking layer 504 may include an organic insulating material such as a white resin, a blue resin, or the like. When the first light-blocking layer 503 includes a blue color of organic insulating material, the first light-blocking layer 503 may include the same material as a third color filter 508, and may be formed in the same operation as the third color filter 508.

The first light-blocking layer 503 may be arranged on a lower surface of the second substrate 501. A first opening OP1 may be arranged between the first light-blocking layer 503, and the color layer 505 may be arranged in the first opening OP1.

The color layer 505 may be an organic material pattern including dyes or pigments. The color layer 505 may include a color filter arranged for each pixel area PX. In detail, the color layer 505 may include a first color filter 506 arranged in the first pixel area PX1, a second color filter 507 arranged in the second pixel area PX2, and the third color filter 508 arranged in the third pixel area PX3.

The first color filter 506 may include a pigment or dye of a first color (for example, red). The first color filter 506 may be formed by forming a first photosensitive color layer including a pigment or dye of the first color and then patterning the first photosensitive color layer. The second color filter 507 may include a pigment or dye of a second color (for example, green). The second color filter 507 may be formed by forming a second photosensitive color layer including a pigment or dye including the second color and then patterning the second photosensitive color layer. The third color filter 508 may include a pigment or dye of a third color (for example, blue). The third color filter 508 may be formed by forming a third photosensitive color layer including a pigment or dye of the third color (for example, blue) and then patterning the third photosensitive color layer.

A first capping layer 509 may be arranged on lower surfaces of the first light-blocking layer 503 and the color layer 505. The first capping layer 509 may cover the first to third color filters 506 to 508. The first capping layer 509 may include an inorganic insulating material, such as silicon nitride, silicon oxide, or silicon oxynitride.

The second light-blocking layer 504 may be arranged on a lower surface of the first capping layer 509. A second opening OP2 may be arranged between the second light-blocking layer 504, and the color conversion-transmissive layer 510 may be located in the second opening OP2.

The color conversion-transmissive layer 510 may be arranged in an area corresponding to the color layer 505 in a vertical direction of the display apparatus 300. The color conversion-transmissive layer 510 may include a color conversion unit 511 or 512 or a transmission unit 513, which is arranged for each pixel area PX. In detail, the color conversion-transmissive layer 510 may include a first color conversion unit 511 arranged in the first pixel area PX1, a second color conversion unit 512 arranged in the second pixel area PX2, and a transmission unit 513 arranged in the third pixel area PX3.

When the first color conversion unit 511 overlaps the first color filter 506 in the first pixel area PX1, the incident light Lib may be converted into the light of first color Lr. The first color conversion unit 511 may include a first quantum dot which may be excited by the incident light Lib and emit the light of first color Lr having a wavelength longer than that of the incident light Lib.

When the second color conversion unit 512 overlaps the second color filter 507 in the second pixel area PX2, the incident light Lib may be converted in to the light of second color Lg. The second color conversion unit 512 may include a second quantum dot which may be excited by the incident light Lib and emit the light of second color Lg having a wavelength longer than the incident light Lib.

The first and second quantum dots are semiconductor particles having a diameter of only 2 nm to 10 nm, and may be particles having unusual electrical and optical properties. When the first and second quantum dots are exposed to light, the first and second quantum dots may emit light of a particular frequency depending on a particle size and a type of material. For example, the quantum dots may emit red, green, and blue light when receiving light, depending on the particle size and/or the type of material. A core of the first and second quantum dots may be selected from a Group II-VI compound, a Group III-V compound, a Group IV-VI compound, a Group IV element, a Group IV compound, and a combination thereof.

When the transmission unit 513 overlaps the third color filter 508 in the third pixel area PX3, the incident light Lib may be transmitted. Accordingly, the light of third color Lb may be emitted through the transmission unit 513 and the third color filter 508. The light of third color Lb is blue light having a peak wavelength within the same wavelength range as the incident light Lib.

The first color conversion unit 511, the second color conversion unit 512, and the transmission unit 513 may include a plurality of scattering particles configured to improve light efficiency. The scattering particles may be titanium oxide $TiO_2$ or metal particles.

The first color conversion unit 511, the second color conversion unit 512, and the transmission unit 513 may be respectively formed in the second opening OP2 defined by the second light-blocking layer 504 by an inkjet method.

A second capping layer 514 may be arranged on lower surfaces of the second light-blocking layer 504 and the color conversion-transmissive layer 510. The second capping layer 514 may cover the first color conversion unit 511, the second color conversion unit 512, and the transmission unit 513. The second capping layer 514 may include an inorganic insulating material, such as silicon nitride, silicon oxide, or silicon oxynitride.

A filler 515 may be arranged between the emission panel 400 and the color panel 500. An upper surface of the filler 515 may be in contact with a lower surface of the second capping layer 514, and a lower surface of the filler 515 may be in contact with the second inorganic encapsulation layer 421 of the thin-film encapsulation layer 419. The filler 515 may act as a buffer against external pressure. The filler 515 may include an organic material such as methyl silicone, phenyl silicone, polyimide, or the like. However, the filler 515 is not limited thereto. the filler 515 may include a urethane resin, an epoxy resin, an acrylic resin, which are an organic sealant, or silicone which is an inorganic sealant. According to some example embodiments, the filler 515 may be a transmissive insulating layer or an air layer.

A column spacer 516 may be arranged in the filler 515. The column spacer 516 may maintain an interval between the emission panel 400 and the color panel 500. The column spacer 516 may be at least one organic insulating material including, for example, polyimide, polyamide, an acrylic resin, benzocyclobutene, and/or a phenol resin. The column spacer 516 is not limited to any one material as long as it is an insulating material which may maintain an interval between the emission panel 400 and the color panel 500.

The column spacer 516 may be arranged around each of the first pixel area PX1, the second pixel area PX2, and the third pixel area PX3. At least a portion of the column spacer 516 may overlap the first laser drilling area LD1, the second laser drilling area LD2, and the third laser drilling area LD3 in a vertical direction of the display apparatus 300. In the first to third laser drilling areas LD1 to LD3, the opposite electrode 411 may be electrically connected to the first power line 414 via the connection electrode 418 and the conductive protective layer 417. The column spacer 516 may be located in an area where the opposite electrode 411 and the first power line 414 are connected.

Figure 5:
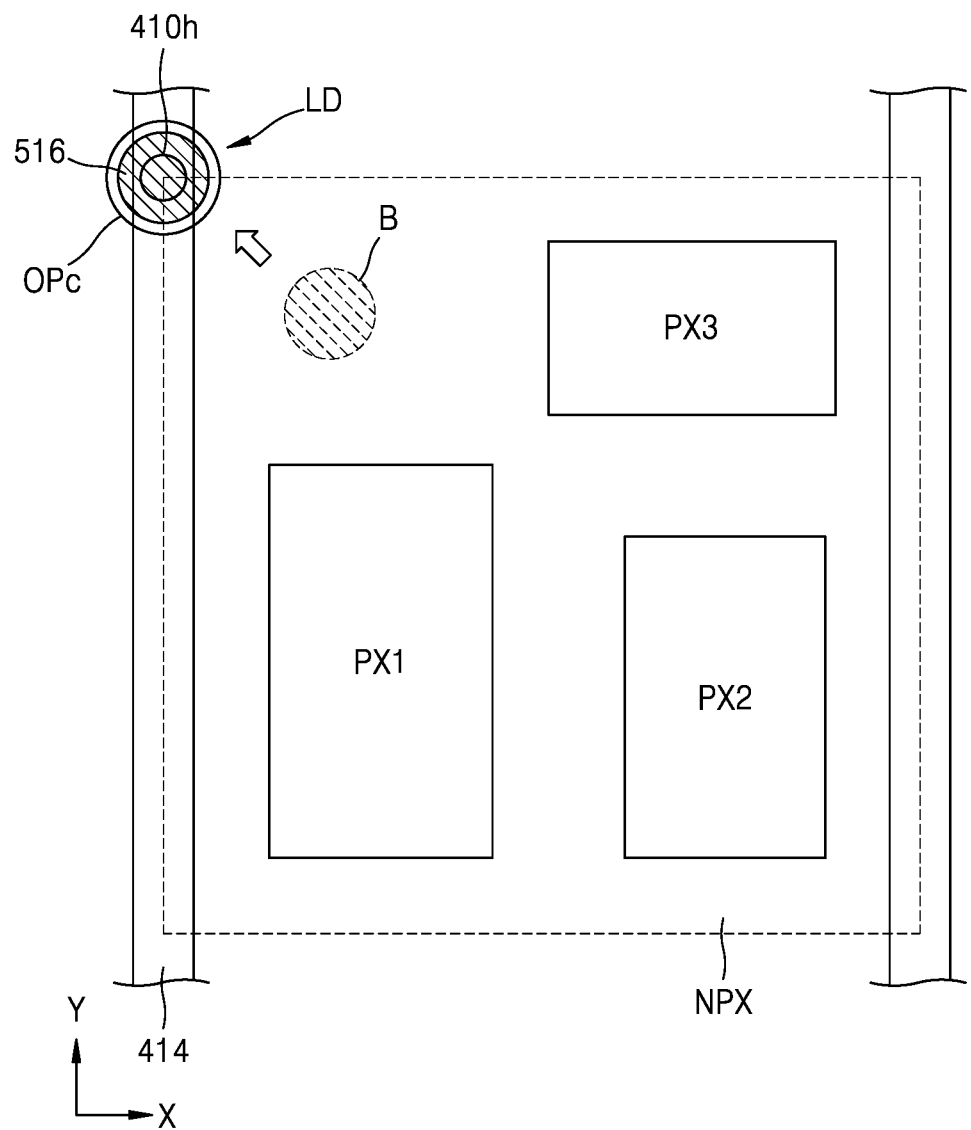
FIG. 5 is a plan view illustrating a laser drilling area and a column spacer of FIG. 3 that overlap each other, according to some example embodiments.

Referring to FIG. 5, the first pixel area PX1 and the second pixel area PX2 may be arranged to be spaced apart from each other at a certain distance in an X-direction, and the second pixel area PX2 and the third pixel area PX3 may be arranged to be spaced apart from each other at a certain distance in a Y-direction. The first pixel area PX1, the second pixel area PX2, and the third pixel area PX3 may be surrounded by the non-pixel area NPX. The non-pixel area NPX may include the laser drilling area LD.

The first power line 414 may be electrically connected to the opposite electrode (411 in FIG. 3) through the through hole 410h and the opening OPc for the connection electrode in the laser drilling area LD. The column spacer 516 may be located in the laser drilling area LD.

In detail, the thin-film encapsulation layer (419 in FIG. 3) may have a thickness which may planarize an upper surface of the emission panel 400. When an uppermost layer of the emission panel 400 is planarized due to the thickness of the thin-film encapsulation layer 419, the column spacer 516 may not need to be arranged not to overlap the laser drilling area LD. Accordingly, the column spacer 516 may be moved from a portion B indicated by a dotted area to be positioned in the laser drilling area LD. The column spacer 516 may completely overlap the laser drilling area LD to which the opposite electrode 411 and the first power line 414 are connected.

As the display apparatus 300 increases in high resolution, a space in which the color layer 505 and the color conversion-transmissive layer 510 arranged on the second substrate 501 may be patterned may be insufficient. When the column spacer 516 overlaps the laser drilling area LD, design freedom of elements such as the color layer 505, the color conversion-transmissive layer 510, or the like may be increased. In addition, a space in which the pixel area PX on the second substrate 501 may be designed may be further secured, thereby increasing an aperture ratio.

Figure 6:
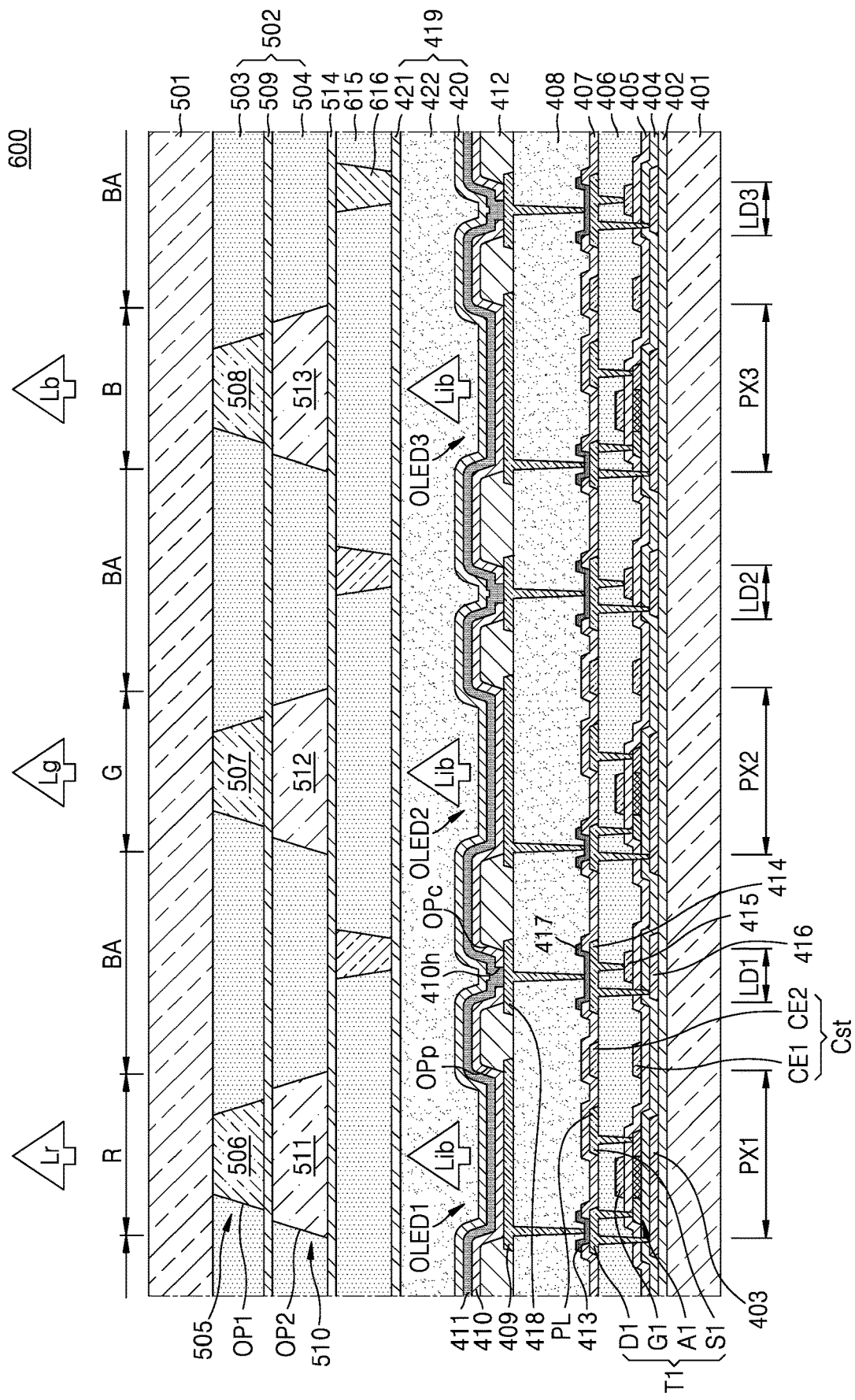
FIG. 6 is a modification of FIG. 3, according to some example embodiments.

FIG. 6 illustrates a display apparatus 600 according to some example embodiments.

The display apparatus 600 of FIG. 6 is substantially the same structure as the display apparatus 300 of FIG. 3 except for a portion in which a column spacer overlaps a laser drilling area, therefore, differences thereof will be mainly described below. The same reference numerals as in FIG. 3 denote the same members.

Referring to FIG. 6, on the first substrate 401, the laser drilling area LD, such as the first laser drilling area LD1, the second laser drilling area LD2, and the third laser drilling area LD3, may be arranged around each of the first pixel area PX1, the second pixel area PX2, and the third pixel area PX3.

The first power line 414 may be arranged in the laser drilling area LD. The first power line 414 may be a line which applies the common voltage ELVSS. The first power line 414 may be electrically connected to the opposite electrode 411 via the conductive protective layer 417 and the connection electrode 418.

The thin-film encapsulation layer 419 may be arranged on an uppermost layer of the first substrate 401. According to some example embodiments, the thin-film encapsulation layer 419 may be a structure in which the first inorganic encapsulation layer 420, the organic encapsulation layer 422, and the second inorganic encapsulation layer 421 are sequentially stacked.

The first color area R, the second color area G, and the third color area B may be arranged on the lower surface of the second substrate 501 facing the first substrate 401. The first color area R, the second color area G, and the third color area B may correspond to the first pixel area PX1, the second pixel area PX2, and the third pixel area PX3. The first color area R, the second color area G, and the third color area B may be covered by a filler 615. A lower surface of the filler 615 may be in contact with an upper surface of the thin-film encapsulation layer 419.

A column spacer 616 may be arranged in the filler 615. The column spacer 616 may maintain an interval between the emission panel 400 and the color panel 500. At least a portion of the column spacer 616 may overlap the first laser drilling area LD1, the second laser drilling area LD2, and the third laser drilling area LD3 in a vertical direction of the display apparatus 600. The column spacer 616 may be located in an area where the opposite electrode 411 and the first power line 414 are connected.

Figure 7:
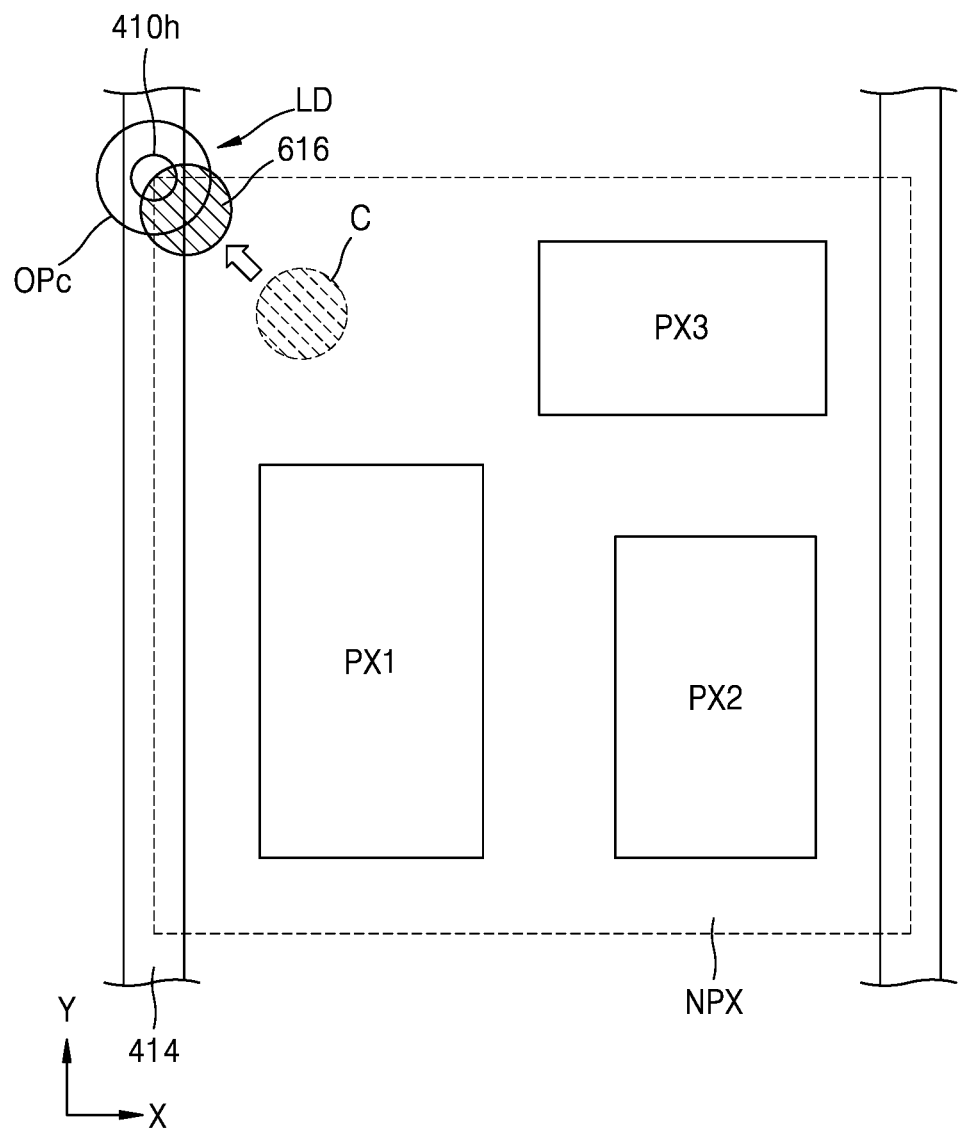
FIG. 7 is a plan view illustrating a laser drilling area and a column spacer of FIG. 6 that overlap each other, according to some example embodiments.

Referring to FIG. 7, the first power line 414 may extend from the non-pixel area NPX in the Y-direction. The non-pixel area NPX may include the laser drilling area LD. The first power line 414 may be electrically connected to the opposite electrode (411 in FIG. 3) through the through hole 410h and the opening OPc for the connection electrode in the laser drilling area LD.

The column spacer 616 may be moved from a portion C indicated by a dotted area to the laser drilling area LD. At this time, the column spacer 616 is not located in the laser drilling area LD as in the case of FIG. 3, and a portion of the column spacer 616, for example, a portion corresponding to a semicircular area of the column spacer 616, may overlap the laser drilling area LD. In other words, the column spacer 616 may not completely overlap the laser drilling area LD, and at least a portion of the column spacer 616 may overlap the laser drilling area LD. Even when at least a portion of the column spacer 616 overlaps the laser drilling area LD, space utilization in other areas of the non-pixel area NPX increases. As a result, design freedom of elements such as the color layer 505, the color conversion-transmissive layer 510, or the like may be increased.

Figure 8:
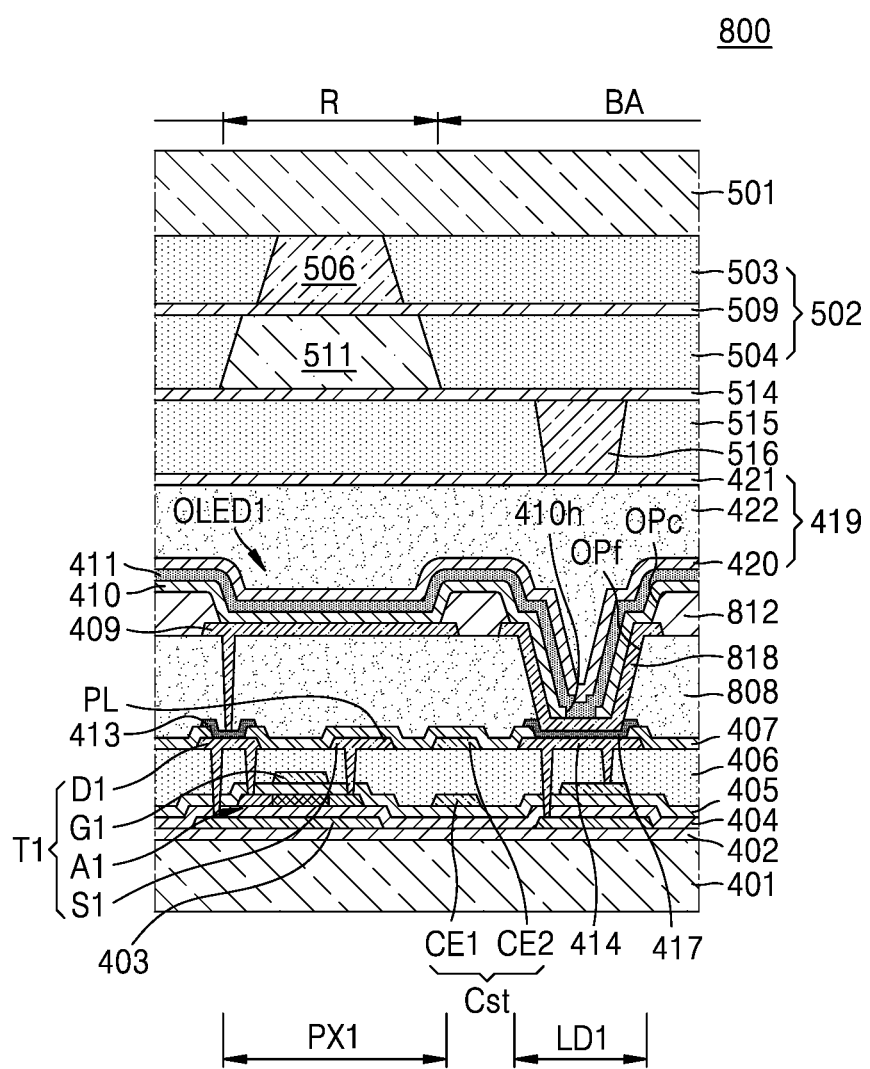
FIG. 8 is a cross-sectional view of a display apparatus according to some example embodiments.

FIG. 8 is a cross-sectional view of a display apparatus 800 according to some example embodiments.

The display apparatus 800 of FIG. 6 is substantially the same structure as the display apparatus 300 of FIG. 3 except a stacked structure of the laser drilling area LD, therefore, differences thereof will be mainly described below. The same reference numerals as in FIG. 3 denote the same members.

Referring to FIG. 8, the first power line 414 may be arranged in the first laser drilling area LD1. The first power line 414 may be a line which applies the common voltage ELVSS. The first power line 414 may be arranged on the first interlayer insulating layer 406. The first power line 414 may be arranged on the same layer as the source electrode S1, the drain electrode D1, the second electrode CE2 of the storage capacitor Cst, and the driving voltage line PL.

The protective layer 407 may cover an edge of the first power line 414. The conductive protective layer 417 may be arranged on an exposed portion of the first power line 414.

A first insulating layer 808 may include an opening OPf for a power line exposing a portion of the first power line 414 and/or a portion of the conductive protective layer 417 which are stacked. The first insulating layer 808 may cover an edge of the conductive protective layer 417, and portions of the conductive protective layer 417 other than the edge may be exposed to the outside. When the conductive protective layer 417 is omitted, a portion of the first power line 414 may be exposed to the outside.

A connection electrode 818 may be arranged on an outer surface of the first insulating layer 808. The connection electrode 818 may be arranged on the same layer as the pixel electrode 409, and may include the same material as the pixel electrode 409. The connection electrode 818 may be connected to the first power line 414 via the opening OPf for the power line. The connection electrode 818 may be connected to the first power line 414 via the conductive protective layer 417.

A second insulating layer 812 may be arranged on the connection electrode 818. The second insulating layer 812 may include an opening OPc for the connection electrode exposing a portion of the connection electrode 818. The opening OPc for the connection electrode in the second insulating layer 812 may overlap the opening OPf for the power line in the first insulating layer 808. The second insulating layer 812 may cover an edge of the connection electrode 818, and portions of the connection electrode 818 other than the edge may be exposed to the outside.

The intermediate layer 410 may be arranged on the second insulating layer 412. The intermediate layer 410 may integrally extend from the first pixel area PX1 to the first laser drilling area LD1. The intermediate layer 410 may cover the second insulating layer 812 and the connection electrode 818. The intermediate layer 410 may include the through hole 410h overlapping the opening OPc for the connection electrode and the opening OPf for the power line. The through hole 410h may be formed through the intermediate layer 410 by a laser drilling operation.

The opposite electrode 411 may be connected to the connection electrode 418 through the opening OPf for the power line in the first insulating layer 808, the opening OPc for the connection electrode in the second insulating layer 812, and the through hole 410h in the intermediate layer 410. The opposite electrode 411 may be electrically connected to the first power line 414 via the connection electrode 418 and the conductive protective layer 417.

Figure 9:
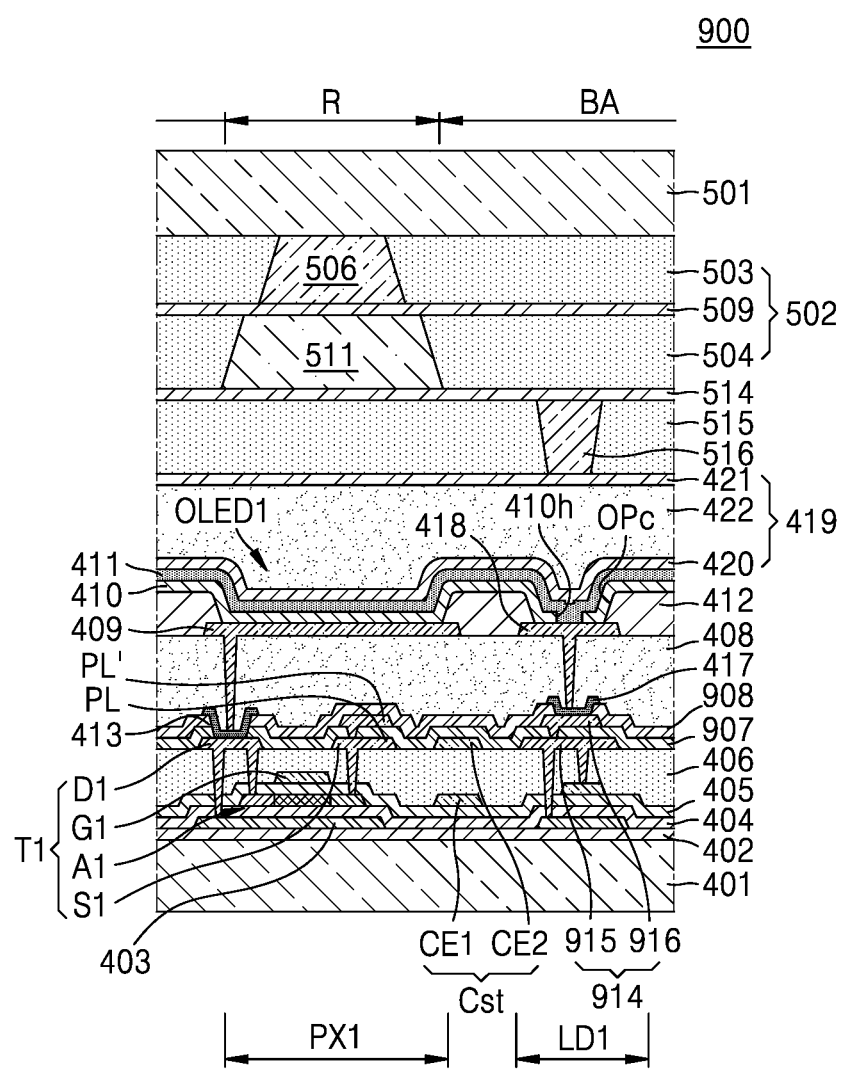
FIG. 9 is a cross-sectional view of a display apparatus according to some example embodiments.

FIG. 9 is a cross-sectional view of a display apparatus 900 according to some example embodiments.

The display apparatus 900 of FIG. 9 is substantially the same structure as the display apparatus 300 of FIG. 3 except for a stacked structure of a first power line, therefore, differences thereof will be mainly described below. The same reference numerals as in FIG. 3 denote the same members.

Referring to FIG. 9, the source electrode S1, the drain electrode D1, the second electrode CE2 of the storage capacitor Cst, and the driving voltage line PL may be arranged on the first interlayer insulating layer 406. The source electrode S1, the drain electrode D1, the second electrode CE2 of the storage capacitor Cst, and the driving voltage line PL may be arranged on the same layer.

A second interlayer insulating layer 907 may be arranged on the first interlayer insulating layer 406. The second interlayer insulating layer 907 may cover the source electrode S1, the drain electrode D1, the second electrode CE2 of the storage capacitor Cst, and the driving voltage line PL. An auxiliary driving voltage line PL' may be arranged on the second interlayer insulating layer 907. The auxiliary driving voltage line PL' may be in contact with the driving voltage line PL or the source electrode S1 of the driving thin-film transistor T1 arranged below the auxiliary driving voltage line PL' through a contact hole penetrating the second interlayer insulating layer 907. The auxiliary driving voltage line PL' may be connected to the driving voltage line PL to function as a line configured to transfer a driving voltage. Because the auxiliary driving voltage line PL' is provided, a voltage drop phenomenon of a driving voltage may be prevented or reduced. Overall, the display apparatus 900 may be provided with a uniform driving voltage.

A first power line 914 may be arranged in the first laser drilling area LD1. The first power line 914 may be a line which applies the common voltage ELVSS. The first power line 914 may include a first conductive layer 915 and a second conductive layer 916 arranged on a different layer from the first conductive layer 915.

The first conductive layer 915 may be arranged on the first interlayer insulating layer 406. The first conductive layer 915 may be arranged on the same layer as the source electrode S1, the drain electrode D1, the second electrode CE2 of the storage capacitor Cst, and the driving voltage line PL.

The second interlayer insulating layer 907 may cover the first conductive layer 915. The second conductive layer 916 may be arranged on the second interlayer insulating layer 907. The second conductive layer 916 may be arranged on the same layer as the auxiliary driving voltage line PL'. The second conductive layer 916 may be in contact with the first conductive layer 915 though a contact hole penetrating the second interlayer insulating layer 907. A protective layer 908 including an inorganic material may cover the second conductive layer 916. The conductive protective layer 417 may be arranged on an exposed portion of the second conductive layer 916. The conductive protective layer 417 may cover the exposed portion of the second conductive layer 916.

The opposite electrode 411 may be connected to the connection electrode 418 through the through hole 410h and the opening OPc for the connection electrode which are communicated. The opposite electrode 411 may be electrically connected to the first power line 914 including the first conductive layer 915 and the second conductive layer 916 via the connection electrode 418 and the conductive protective layer 417.

Figure 10:
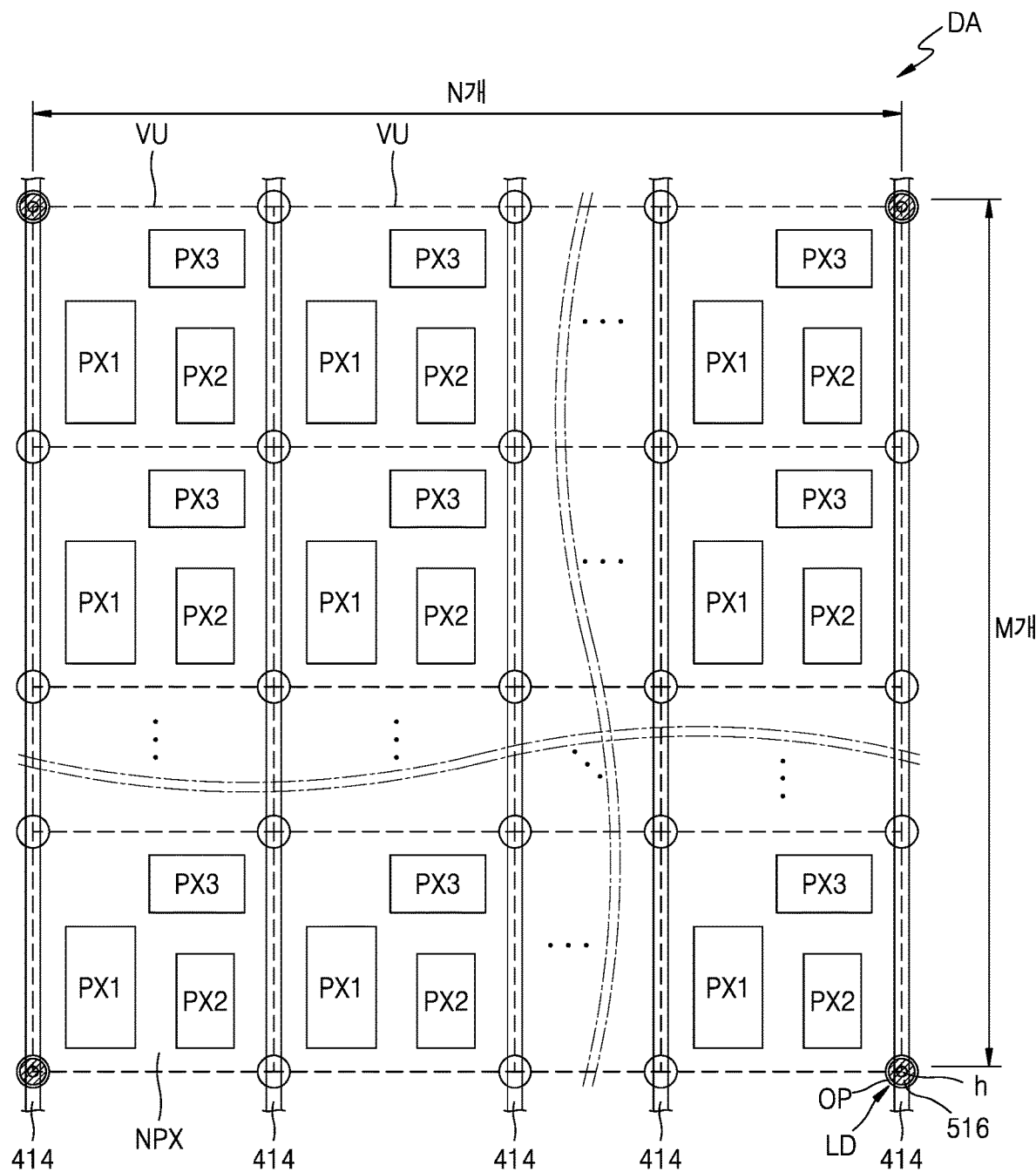
FIG. 10 is a plan view illustrating a laser drilling area and a column spacer that overlap each other, according to some example embodiments.

FIG. 10 is a plan view illustrating that the laser drilling area LD and the column spacer 516 according to some example embodiments overlap each other.

Referring to FIG. 10, a plurality of first power lines 414 may be arranged in the display area DA to be spaced apart from each other. An opening OP corresponding to the opening OPc for the connection electrode formed in the second insulating layer 412 of FIG. 3 may overlap the first power line 414. A through hole h corresponding to the through hole 410h formed in the intermediate layer 410 of FIG. 3 may overlap the opening OP.

A virtual unit VU may be repeatedly arranged in the display area DA. A position where the opposite electrode (411 of FIG. 3) and the first power line 414 are electrically connected, for example, an overlapping portion of the opening OP and the through hole h, may be located at four corners of the virtual unit VU having M×N pieces. Among a plurality of openings OP in the M×N pieces of virtual units VU, the opening OP in which the through hole h is not formed may have a dummy connection structure.

The column spacer 516 may be located in the laser drilling area LD, which is an area where the opposite electrode 411 and the first power line 414 are connected. At least a portion of the column spacer 516 may overlap the laser drilling area LD in which the opening OP overlap the through hole h.

Figure 11:
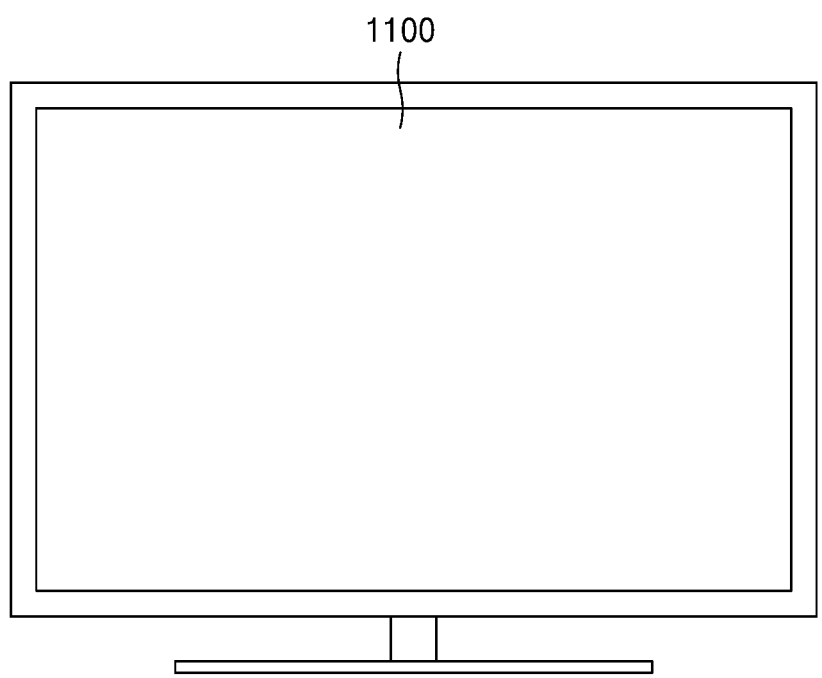
FIGS. 11 and 12 are diagrams of electronic devices including display apparatuses according to some example embodiments.
Figure 12:
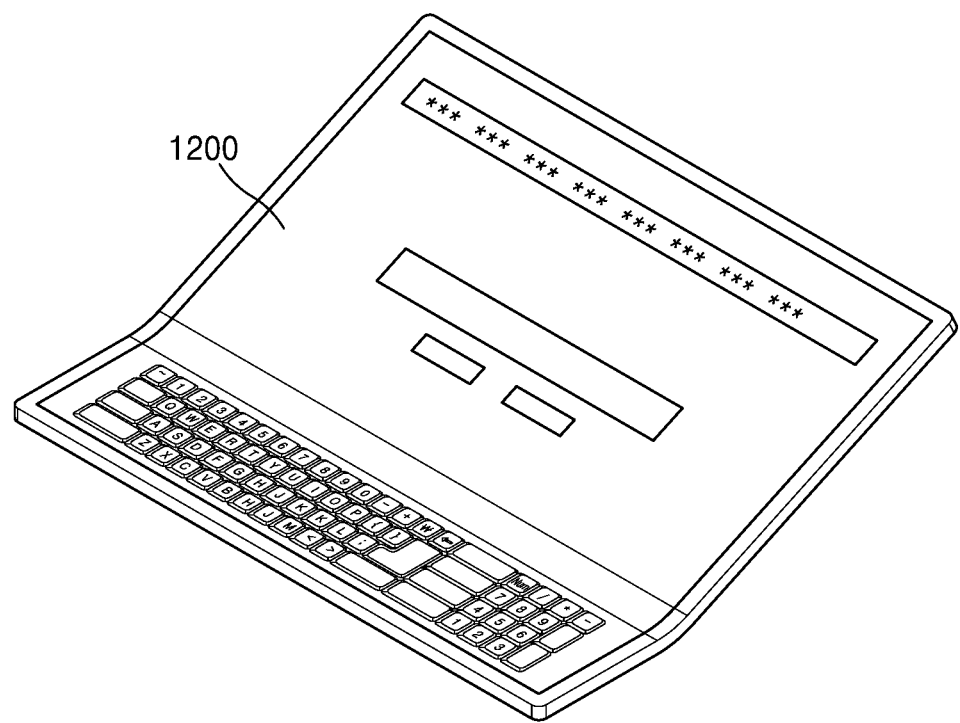

FIGS. 11 and 12 are diagrams of electronic devices including display apparatuses 1100 and 1200 according to some example embodiments.

Referring to FIGS. 11 and 12, the display apparatuses 1100 and 1200 may be provided in electronic devices such as a television or a monitor, or in electronic devices such as a laptop. Alternatively, the display apparatuses 1100 and 1200 may be used in various electronic devices such as a smart picture frame or a large billboard.

The display apparatuses 1100 and 1200 are not used only in electronic devices having a horizontally long rectangular screen. For example, the display apparatuses 1100 and 1200 may be used in electronic devices having a vertically long rectangular screen.

A display apparatus according to some example embodiments of the present disclosure may implement a display apparatus in which space utilization of a substrate is relatively improved as a laser drilling area overlaps a column spacer.

Characteristics of embodiments according to the present disclosure may be understood from the contents described below with reference to the accompanying drawings, in addition to the above descriptions.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
    an emission panel comprising a first light-emitting diode, a second light-emitting diode, a third light-emitting diode, and a first power line, wherein
    the first light-emitting diode, the second light-emitting diode, and the third light-emitting diode are each arranged in a pixel area and each have a stacked structure including a pixel electrode, an intermediate layer having an emission layer, and an opposite electrode, and
    the first power line is in a laser drilling area around the pixel area and electrically connected to the first light-emitting diode, the second light-emitting diode, and the third light-emitting diode; and
    a color panel on the emission panel and comprising a first color area, a second color area, a third color area, which are each capable of transmitting light of different colors, and a light-blocking area,
    wherein a column spacer is between the emission panel and the color panel and has at least a portion overlapping the laser drilling area in a vertical direction,
    wherein the column spacer includes at least one organic insulating material.

2. The display apparatus of claim 1, wherein the intermediate layer extends from the pixel area to the laser drilling area, and comprises a through hole in the laser drilling area,
    the opposite electrode integrally extends across the pixel area and the laser drilling area, and
    the first power line is electrically connected to the opposite electrode through the through hole in the laser drilling area.

3. The display apparatus of claim 2, wherein a thin-film encapsulation layer is on the emission panel,
a filler is on the color panel facing the emission panel, and
the column spacer is in the filler, and at least a portion of the column spacer overlaps the laser drilling area to which the opposite electrode and the first power line are connected.

4. The display apparatus of claim 3, wherein the column spacer is in the laser drilling area.

5. The display apparatus of claim 3, wherein at least a portion of the column spacer overlaps the laser drilling area.

6. The display apparatus of claim 2, wherein a connection electrode is on a same layer as the pixel electrode in the laser drilling area,
an upper surface of the connection electrode is electrically connected to the opposite electrode, and
a lower surface of the connection electrode is electrically connected to the first power line.

7. The display apparatus of claim 6, wherein a first insulating layer covering at least a portion of the first power line is on the first power line,
the connection electrode is on the first insulating layer,
a second insulating layer covering at least a portion of the connection electrode and having an opening for a connection electrode is on the connection electrode,
the intermediate layer covers an outer surface of the second insulating layer, the through hole in the intermediate layer overlaps the opening for the connection electrode, and
the opposite electrode is electrically connected to the first power line through the opening for the connection electrode in the second insulating layer and the through hole in the intermediate layer.

8. The display apparatus of claim 6, wherein a first insulating layer covering at least a portion of the first power line and having an opening for a power line is on the first power line,
the connection electrode is on the first insulating layer,
a second insulating layer covering at least a portion of the connection electrode and having an opening for a connection electrode is on the connection electrode,
the intermediate layer covers the second insulating layer and the connection electrode, the through hole in the intermediate layer overlaps the opening for the power line and the opening for the connection electrode, and
the opposite electrode is electrically connected to the first power line through the opening for the power line in the first insulating layer, the opening for the connection electrode in the second insulating layer, and the through hole in the intermediate layer.

9. The display apparatus of claim 2, wherein a thin-film transistor electrically connected to each of the first light-emitting diode, the second light-emitting diode, and the third light-emitting diode and having a semiconductor layer, a gate electrode, a source electrode, and a drain electrode is arranged in the pixel area, and
the first power line comprises a first conductive layer on a same layer as the source electrode.

10. The display apparatus of claim 2, wherein a thin-film transistor electrically connected to each of the first light-emitting diode, the second light-emitting diode, and the third light-emitting diode and having a semiconductor layer, a gate electrode, a source electrode, and a drain electrode is in the pixel area, and
the first power line comprises a first conductive layer on a same layer as the source electrode and a second conductive layer electrically connected to the first conductive layer.

11. The display apparatus of claim 1, wherein a conductive protective layer covers the first power line.

12. The display apparatus of claim 1, wherein the color panel comprises:
a light-blocking layer corresponding to the light-blocking area;
a color conversion-transmissive layer comprising a color conversion unit configured to convert incident light into light of other colors and a transmission unit configured to transmit the incident light; and
a color layer comprising a plurality of color filters overlapping the color conversion-transmissive layer.

13. The display apparatus of claim 12, wherein the color conversion unit comprises a plurality of quantum dots.

14. The display apparatus of claim 1, wherein a plurality of first power lines are spaced apart from each other around a plurality of pixel areas which are adjacently arranged, and
an area in which the laser drilling area and the column spacer overlap is selectively arranged around the plurality of pixel areas.

15. A display apparatus comprising:
a first substrate comprising a pixel area and a laser drilling area arranged around the pixel area;
a light-emitting diode arranged in the pixel area, electrically connected to a thin-film transistor, and having a stacked structure including a pixel electrode, an intermediate layer having an emission layer, and an opposite electrode;
a first power line in the laser drilling area and electrically connected to the light-emitting diode;
a thin-film encapsulation layer covering the pixel area and the laser drilling area;
a second substrate including a first color area, a second color area, a third color area, which are each capable of transmitting light of different colors, and a light-blocking area;
a filler covering the first color area, the second color area, the third color area, and the light-blocking area; and
a column spacer in the filler, wherein at least a portion of the column spacer overlaps the laser drilling area in a vertical direction,
wherein the column spacer includes at least one organic insulating material.

16. The display apparatus of claim 15, wherein the filler faces the thin-film encapsulation layer; and
at least a portion of the column spacer overlaps the laser drilling area to which the opposite electrode and the first power line are connected.

17. The display apparatus of claim 16, wherein the column spacer is in the laser drilling area.

18. The display apparatus of claim 16, wherein at least a portion of the column spacer overlaps the laser drilling area.

19. The display apparatus of claim 15, wherein the intermediate layer extends from the pixel area to the laser drilling area and has a through hole in the laser drilling area,
the opposite electrode integrally extends across the pixel area and the laser drilling area, and
the first power line is electrically connected to the opposite electrode through the through hole in the laser drilling area.

20. The display apparatus of claim 19, wherein a connection electrode is on a same layer as the pixel electrode in the laser drilling area, an upper surface of the connection electrode is electrically connected to the opposite electrode, and
a lower surface of the connection electrode is electrically connected to the first power line.

\* \* \* \* \*